(12) United States Patent
Larson, III

(10) Patent No.: US 7,408,428 B2
(45) Date of Patent: Aug. 5, 2008

(54) TEMPERATURE-COMPENSATED FILM BULK ACOUSTIC RESONATOR (FBAR) DEVICES

(75) Inventor: John D. Larson, III, Palo Alto, CA (US)

(73) Assignee: Avago Technologies Wireless IP (Singapore) Pte. Ltd., Singapore (SG)

(*) Notice: Subject to any disclaimer, the term of this patent is extended or adjusted under 35 U.S.C. 154(b) by 53 days.

(21) Appl. No.: 10/977,398

(22) Filed: Oct. 29, 2004

(65) Prior Publication Data

US 2005/0110598 A1 May 26, 2005

Related U.S. Application Data

(63) Continuation-in-part of application No. 10/965,541, filed on Oct. 13, 2004, and a continuation-in-part of application No. 10/965,637, filed on Oct. 13, 2004, and a continuation-in-part of application No. 10/699,289, filed on Oct. 30, 2003, now Pat. No. 7,019,605, and a continuation-in-part of application No. 10/699,481, filed on Oct. 30, 2003, now Pat. No. 6,946,928.

(51) Int. Cl.
*H03H 9/15* (2006.01)
*H03H 9/54* (2006.01)
*H03H 3/04* (2006.01)

(52) U.S. Cl. .................. 333/187; 333/189; 310/346
(58) Field of Classification Search ......... 333/187–189; 310/346
See application file for complete search history.

(56) References Cited

U.S. PATENT DOCUMENTS

| | | | |
|---|---|---|---|
| 3,174,122 A | 3/1965 | Fowler et al. | |
| 3,189,851 A | 6/1965 | Fowler | |
| 3,321,648 A | 5/1967 | Kolm | |
| 3,422,371 A | 1/1969 | Poirier et al. | |
| 3,568,108 A | 3/1971 | Poirier et al. | |
| 3,582,839 A | 6/1971 | Pim et al. | |
| 3,590,287 A | 6/1971 | Berlincourt et al. | |
| 3,607,761 A | 9/1971 | Nakagawa | |
| 3,610,969 A | 10/1971 | Clawson et al. | |
| 3,826,931 A | 7/1974 | Hammond | |
| 3,845,402 A | 10/1974 | Nupp | |

(Continued)

FOREIGN PATENT DOCUMENTS

DE 10160617 A1 6/2003

(Continued)

OTHER PUBLICATIONS

Lakin, K.M., "Bulk Acoustic Wave Coupled Resonator Filters", IEEE International Frequency Control Symposium and PDA Exhibition, 2002, pp. 8-14, May 29-31, 2002.

(Continued)

*Primary Examiner*—Barbara Summons

(57) ABSTRACT

The temperature-compensated film bulk acoustic resonator (FBAR) device comprises an FBAR stack. The FBAR stack comprises an FBAR and a temperature-compensating element. The FBAR is characterized by a resonant frequency having a temperature coefficient, and comprises opposed planar electrodes and a piezoelectric element between the electrodes. The piezoelectric element has a temperature coefficient on which the temperature coefficient of the resonant frequency depends at least in part. The temperature-compensating element has a temperature coefficient opposite in sign to the temperature coefficient of the piezoelectric element.

37 Claims, 12 Drawing Sheets

U.S. PATENT DOCUMENTS

| | | | |
|---|---|---|---|
| 4,084,217 A | 4/1978 | Brandis et al. | |
| 4,172,277 A | 10/1979 | Pinson | |
| 4,272,742 A | 6/1981 | Lewis | |
| 4,281,299 A | 7/1981 | Newbold | |
| 4,320,365 A | 3/1982 | Black et al. | |
| 4,355,408 A | 10/1982 | Scarrott | |
| 4,456,850 A | 6/1984 | Inoue et al. | 310/324 |
| 4,529,904 A | 7/1985 | Hattersley | |
| 4,625,138 A | 11/1986 | Ballato | |
| 4,719,383 A * | 1/1988 | Wang et al. | 310/324 |
| 4,798,990 A | 1/1989 | Henoch | |
| 4,836,882 A | 6/1989 | Ballato | |
| 4,841,429 A | 6/1989 | McClanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,587,620 A | 12/1996 | Ruby et al. | 310/346 |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,714,917 A | 2/1998 | Ella | |
| 5,853,601 A | 12/1998 | Krishaswamy et al. | |
| 5,864,261 A | 1/1999 | Weber | |
| 5,872,493 A | 2/1999 | Ella | |
| 5,873,153 A | 2/1999 | Ruby et al. | |
| 5,873,154 A | 2/1999 | Ylilammi et al. | |
| 5,910,756 A | 6/1999 | Ella | |
| 5,936,150 A | 8/1999 | Kobrin et al. | |
| 5,953,479 A | 9/1999 | Zhou et al. | |
| 5,982,297 A | 11/1999 | Welle | |
| 6,040,962 A | 3/2000 | Kanazawa | |
| 6,060,818 A | 5/2000 | Ruby et al. | |
| 6,087,198 A | 7/2000 | Panasik | |
| 6,107,721 A | 8/2000 | Lakin | 310/321 |
| 6,111,480 A | 8/2000 | Iyama et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | 333/187 |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | 333/133 |
| 6,265,246 B1 | 7/2001 | Ruby et al. | |
| 6,278,342 B1 | 8/2001 | Ella | |
| 6,292,336 B1 | 9/2001 | Horng | |
| 6,307,447 B1 | 10/2001 | Barber et al. | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 * | 7/2002 | Larson, III | 310/346 |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 * | 8/2002 | Shibata | 310/320 |
| 6,441,539 B1 * | 8/2002 | Kitamura et al. | 310/346 |
| 6,462,631 B2 | 10/2002 | Bradley et al. | |
| 6,466,105 B1 | 10/2002 | Lobl et al. | |
| 6,466,418 B1 | 10/2002 | Horng | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Larson et al. | |
| 6,486,751 B1 | 11/2002 | Barber et al. | |
| 6,489,688 B1 | 12/2002 | Baumann et al. | |
| 6,492,883 B2 * | 12/2002 | Liang et al. | 333/132 |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panasik | |
| 6,550,664 B2 | 4/2003 | Bradley et al. | |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 * | 6/2003 | Klee et al. | 333/188 |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ellaet al. | 333/133 |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,724,266 B2 | 4/2004 | Piazza et al. | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta et al. | |
| 6,874,211 B2 | 4/2005 | Bradley et al. | |
| 6,874,212 B2 | 4/2005 | Larson, III | |
| 6,888,424 B2 * | 5/2005 | Takeuchi et al. | 333/187 |
| 6,900,705 B2 | 5/2005 | Nakamura et al. | |
| 6,903,452 B2 | 6/2005 | Ma et al. | |
| 6,906,451 B2 * | 6/2005 | Yamada et al. | 310/324 |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 * | 8/2005 | Peczalski | 310/346 |
| 6,946,928 B2 | 9/2005 | Larson, III et al. | |
| 6,954,121 B2 | 10/2005 | Bradley et al. | |
| 6,963,257 B2 | 11/2005 | Ella et al. | |
| 6,975,183 B2 | 12/2005 | Aigner et al. | |
| 6,977,563 B2 | 12/2005 | Komuro et al. | |
| 6,985,052 B2 | 1/2006 | Tikka | |
| 6,987,433 B2 | 1/2006 | Larson et al. | |
| 6,989,723 B2 * | 1/2006 | Komuro et al. | 333/133 |

| | | | |
|---|---|---|---|
| 6,998,940 B2 | 2/2006 | Metzger | |
| 7,019,604 B2 | 3/2006 | Gotoh et al. | |
| 7,019,605 B2 | 3/2006 | Larson, III | |
| 7,057,476 B2 | 6/2006 | Hwu | |
| 7,084,553 B2 | 8/2006 | Ludwiczak | |
| 7,091,649 B2 | 8/2006 | Larson | |
| 7,098,758 B2 | 8/2006 | Wang et al. | |
| 7,170,215 B2 | 1/2007 | Namba et al. | |
| 7,173,504 B2 | 2/2007 | Larson | |
| 7,187,254 B2 | 3/2007 | Su et al. | |
| 7,230,509 B2 | 6/2007 | Stoemmer | |
| 2002/0000646 A1 | 1/2002 | Gooch et al. | |
| 2002/0030424 A1 | 3/2002 | Iwata | |
| 2002/0121944 A1 | 9/2002 | Larson, III et al. | |
| 2002/0121945 A1 | 9/2002 | Ruby et al. | |
| 2002/0152803 A1 | 10/2002 | Larson, III et al. | |
| 2002/0190814 A1* | 12/2002 | Yamada et al. | 333/187 |
| 2003/0001251 A1 | 1/2003 | Cheever et al. | |
| 2003/0006502 A1 | 1/2003 | Karpman | |
| 2003/0087469 A1 | 5/2003 | Ma | |
| 2003/0102776 A1 | 6/2003 | Takeda et al. | |
| 2003/0111439 A1 | 6/2003 | Fetter et al. | |
| 2003/0128081 A1 | 7/2003 | Ella et al. | 333/133 |
| 2003/0132493 A1 | 7/2003 | Kang et al. | |
| 2003/0141946 A1 | 7/2003 | Ruby et al. | |
| 2003/0179053 A1 | 9/2003 | Aigner et al. | |
| 2004/0092234 A1 | 5/2004 | Pohjonen | |
| 2004/0124952 A1 | 7/2004 | Tikka | |
| 2004/0150293 A1 | 8/2004 | Unterberger | |
| 2004/0150296 A1 | 8/2004 | Park et al. | |
| 2004/0195937 A1* | 10/2004 | Matsubara et al. | 310/320 |
| 2004/0257172 A1 | 12/2004 | Schmidhammer et al. | |
| 2004/0263287 A1 | 12/2004 | Ginsburg et al. | |
| 2005/0012570 A1 | 1/2005 | Korden et al. | |
| 2005/0023931 A1 | 2/2005 | Bouche et al. | |
| 2005/0030126 A1 | 2/2005 | Inoue et al. | |
| 2005/0036604 A1 | 2/2005 | Scott et al. | |
| 2005/0057117 A1* | 3/2005 | Nakatsuka et al. | 310/311 |
| 2005/0057324 A1 | 3/2005 | Onishi et al. | |
| 2005/0068124 A1 | 3/2005 | Stoammer | |
| 2005/0093396 A1 | 5/2005 | Larson et al. | |
| 2005/0093653 A1 | 5/2005 | Larson, III | |
| 2005/0093654 A1 | 5/2005 | Larson, III et al. | |
| 2005/0093655 A1 | 5/2005 | Larson, III et al. | |
| 2005/0093657 A1 | 5/2005 | Larson et al. | |
| 2005/0093658 A1 | 5/2005 | Larson, III et al. | |
| 2005/0093659 A1 | 5/2005 | Larson, III et al. | |
| 2005/0104690 A1 | 5/2005 | Larson et al. | |
| 2005/0110598 A1 | 5/2005 | Larson, III | |
| 2005/0128030 A1 | 6/2005 | Larson et al. | |
| 2005/0140466 A1 | 6/2005 | Larson, III et al. | |
| 2005/0167795 A1 | 8/2005 | Higashi | |
| 2005/0193507 A1* | 9/2005 | Ludwiczak | 15/93.1 |
| 2005/0206271 A1 | 9/2005 | Higuchi et al. | |
| 2005/0218488 A1 | 10/2005 | Mie | |
| 2006/0087199 A1 | 4/2006 | Larson et al. | |
| 2006/0103492 A1 | 5/2006 | Feng et al. | |
| 2006/0132262 A1 | 6/2006 | Fazzio et al. | |
| 2006/0164183 A1 | 7/2006 | Tikka | |
| 2006/0185139 A1 | 8/2006 | Larson, III et al. | |
| 2007/0084964 A1 | 4/2007 | John et al. | |
| 2007/0085447 A1 | 4/2007 | Larson | |
| 2007/0085631 A1 | 4/2007 | Larson et al. | |
| 2007/0085632 A1 | 4/2007 | Larson et al. | |
| 2007/0086080 A1 | 4/2007 | Larson et al. | |
| 2007/0086274 A1 | 4/2007 | Nishimura et al. | |
| 2007/0090892 A1 | 4/2007 | Larson | |
| 2007/0170815 A1 | 7/2007 | Unkrich | |
| 2007/0171002 A1 | 7/2007 | Unkrich | |

FOREIGN PATENT DOCUMENTS

| | | | |
|---|---|---|---|
| EP | 0865157 | | 9/1998 |
| EP | 0 880 227 | | 11/1998 |
| EP | 0973256 | | 1/2000 |
| EP | 1 100 196 A2 | | 5/2001 |
| EP | 1096259 | | 5/2001 |
| EP | 1258990 | | 11/2002 |
| EP | 1180494 | | 3/2003 |
| EP | 1 542 362 | | 6/2003 |
| EP | 1 557 945 | | 10/2003 |
| EP | 1258989 | | 1/2004 |
| EP | 1528674 | | 6/2004 |
| EP | 1528675 | | 6/2004 |
| EP | 1528677 | | 7/2004 |
| EP | 1 517 444 | | 8/2004 |
| EP | 1249932 | | 3/2005 |
| EP | 1517443 | | 3/2005 |
| EP | 1575165 | | 9/2005 |
| GB | 1207974 | | 11/1967 |
| GB | 2411239 | | 8/2005 |
| GB | 2418791 | | 4/2006 |
| JP | 2002-217676 | * | 8/2002 |
| WO | WO 98/16957 | | 4/1998 |
| WO | WO-01/06647 | | 1/2001 |
| WO | WO-01/99276 | | 12/2001 |
| WO | WO-02/103900 | | 12/2002 |
| WO | WO 2003/005880 | | 1/2003 |
| WO | WO 03/030358 | | 4/2003 |
| WO | WO-03/043188 | | 5/2003 |
| WO | WO 03/058809 | | 7/2003 |
| WO | WO 2004/034579 | | 4/2004 |
| WO | WO 03/050950 | | 6/2004 |
| WO | WO-2004/051744 | | 6/2004 |
| WO | WO-2005/043752 | | 5/2005 |
| WO | WO-2005/043753 | | 5/2005 |
| WO | WO-2005/043756 | | 5/2005 |

OTHER PUBLICATIONS

Martin, et al., "Developmental of Low-Dielectric Constant Polymer for Fabrication of Integrated Circuit Interconnect", 12 Advanced Materials, pp. 1769-1778 (2000).

Krishnaswamy, S.V., et al., "Film Bulk Acoustic Wave Resonator Technology", Ultrasonic Symposium, 1990, pp. 629-636.

B. Hadimioglu et al., "Polymer Films As Acoustic Matching Layers", 1990 IEEE Ultrasonics Sysmposium Proceedings, vol. 3 pp. 1337-1340, Dec.1990.

Jung, Jun-Phil, "Experimental and Theoretical INvestigation on the Relationship between AIN Properties and AIN-based FBAR Characteristics", IEEE Internations Frequency Control Symposium, May 4, 2003, pp. 779-784.

Lobi, H.P., et al., "Piezoelectric Material for BAW Resonators and Filters", IEEE Ultrasonics Symposium Oct. 5, 2003, pp. 807-811.

Reinhardt, Alexandre et al., "Design of Coupled Resonator Filters Using Admittance And Scattering Matrices", 2003 IEEE Ultrasonics Symposium Oct. 5, 2003, pp. 1428-1431.

Yang, C.-M., Highly C-Axis-Oriented AIN Film Using MOCVD for 5GHz-Band FBAR Filter, IEEE Ultrasonics Symposium, Oct. 5, 2003, pp. 170-173.

Examination Report from corresponding application No. GB0605971.1 dated Aug. 24, 2006.

Examination Report corresponding to application No. GB0605775.6 dated Aug. 30, 2006.

Examination Report corresponding to application No. GB0605770.7 dated Aug. 25, 2006.

Holzlohner, Ronald et al., "Accurate Calculation of Eye Diagrams and Bit Error Rates in Optical Transmission Systems Using Linearization", Journal of Lightwave Technology, vol. 20, No. 3, (Mar. 2002), pp. 389-400.

Lakin, K.M. "Coupled Resonator Filters", 2002 IEEE Ultrasonic Symposium, (Mar. 2, 2002), pp. 901-908.

Lakin, K.M. et al., "High Performance Stacked Crystal Filters for GPS and Wide Bandwidth Applications", 2001 IEEE Ultrasonics Symposium, (Jan. 1, 2001), pp. 633-636.

LOBL, H.P. et al., "Piezoelectric Materials For BAW Resonators And Filters", 2001 IEEE Ultrasonics Symposium (Jan. 1, 2001),807-811.

"Search report from corresponding application No.", GB0620152.9, (Nov. 15, 2006),.

"Search report from corresponding application No.", GB0620655.1, (Nov. 17, 2006),.

"Search report from corresponding application No.", GB0620653.6, (Nov. 17, 2006),.

"Search report from corresponding application No.", GB0620657.7, (Nov. 23, 2006),.

Coombs, Clyde F., et al., "Electronic Instrument Handbook", Second Edition, McGraw-Hill, Inc., (1995),pp. 5.1 to 5.29.

U.S. Appl. No. 10/971169, filed Oct. 22, 2004, Larson et al.

"A partial copy of GB Search Report for", Application No. GB0522393.8, (Jan. 9, 2006),4 pages.

"A partial copy of GB Search Report for Application No.", GB05255884.3, (Feb. 2, 2006),4 pgs.

Auld, B. A., "Acoustic Resonators", *Acoustic Fields and Waves in Solids*, Second Edition, Vol. II, (1990),250-259.

"British Search Report Application No.", 0605222.9, (Jul. 11, 2006),.

Tiersten, H. F., et al., "An Analysis of Thiskness-Extensional Trapped Energy Resonant Device Structures with Rectangular Electrodes in the Piezoelectric Thin Film on Silicon Configuration", *J. Appl. Phys.*, 54(10), (Oct. 1983),5893-5910.

"Search Report from corresponding application", No. GB0605225.2, (Jun. 26, 2006).

"Search Report for Great Britain Patent Application", No. 0617742.2, (Mar. 29, 2007),.

"Search Report for Great Britain Patent Application", No. 06177422, (Dec. 13, 2006),.

"Search Report in the Great Britain Patent Application", No. 0619698.4, (Nov. 30, 2006),.

Ruby, R. et al., "The Effect of Perimeter Geometry on FBAR Resonator Electrical Performance", *Microwave Symposium Digest*, 2005 IEEE MTT-S International, (Jun. 12, 2005),217-221).

Schuessler, Hans H., "Ceramic Filters and Resonators", Reprinted from *IEEE Trans. Sonics Ultrason.*, vol. SU-21, (Oct. 1974),257-268.

Fattinger, G. G., et al., "Coupled Bulk Acoustic Wave Resonator Filters: Key technology for single-to-balanced RF filters", 0-7803-8331-1/4/W20.00; *IEEE MTT-S Digest*, (2004),927-929.

Choi, Sungjin et al., "Design of Half-Bridge Piezo-Transformer Converters in the AC Adapter Applications", IEEE 2005, 244-248.

Li, Yunxiu et al., "AC-DC Converter with Worldwide Range Input Voltage by Series and Parallel Piezoelectric Transformer Connection", 35th Annual IEEE Power Electronics Specialists Conference, (2004),.

Ivensky, Gregory et al., "A Comparison of Piezoelectric Transformer AC/DC Converters with Current Doubler and voltage Doubler Rectifiers", IEEE Transactions on Power Electronics, vol. 19, No. 6., (Nov. 2004),.

Navas, J. et al., "Miniaturised Battery Charger using Piezoelectric Transformers", IEEE, (2001),492-496.

Jiang, Yimin et al., "A Novel Single-Phase Power Factor Correction Scheme", IEEE, (1993),287-292.

\* cited by examiner

TEMPERATURE-COMPENSATED FILM BULK ACOUSTIC RESONATOR (FBAR) DEVICES

RELATED APPLICATIONS

This application is a Continuation-in-Part of the following U.S. patent applications: Ser. No. 10/699,289 filed Oct. 30, 2003, now U.S. Pat. No. 7,019,605 of John D. Larson III entitled Stacked Bulk Acoustic Resonator Band-Pass Filter with Controllable Pass Bandwidth, Ser. No. 10/699,481 filed Oct. 30, 2003 now U.S. Pat. No. 6,946,928 of John D. Larson III and Richard Ruby entitled Thin-Film Acoustically-Coupled Transformer, Ser. No. 10/965,541 filed Oct. 13, 2004 of John D. Larson III, Richard Ruby and Stephen Ellis entitled Decoupled Stacked Bulk Acoustic Resonator Band-Pass Filter with Controllable Pars Bandwidth, and Ser. No. 10/965,637 filed Oct. 13, 2004 of John D. Larson III, Richard Ruby and Stephen Ellis entitled Film Acoustically-Coupled Transformer. The above applications are all assigned to the assignee of this application and the disclosures of the above applications are incorporated into this application by reference.

BACKGROUND

FBAR devices that incorporate one or more film bulk acoustic resonators (FBARs) form part of an ever-widening variety of electronic products, especially wireless products. For example, modern cellular telephones incorporate a duplexer in which each of the band-pass filters includes a ladder circuit in which each element of the ladder circuit is an FBAR. A duplexer incorporating FBARs is disclosed by Bradley et al. in U.S. Pat. No. 6,262,637 entitled Duplexer Incorporating Thin-film Bulk Acoustic Resonators (FBARs), assigned to the assignee of this disclosure and incorporated into this disclosure by reference. Such duplexer is composed of a transmitter band-pass filter connected in series between the output of the transmitter and the antenna and a receiver band-pass filter connected in series with 90° phase-shifter between the antenna and the input of the receiver. The center frequencies of the pass-bands of the transmitter band-pass filter and the receiver band-pass filter are offset from one another. Ladder filters based on FBARs are also used in other applications.

FIG. 1 shows an exemplary embodiment of an FBAR-based band-pass filter 10 suitable for use as the transmitter band-pass filter of a duplexer. The transmitter band-pass filter is composed of series FBARs 12 and shunt FBARs 14 connected in a ladder circuit. Series FBARs 12 have a higher resonant frequency than shunt FBARs 14.

FIG. 2 shows an exemplary embodiment 30 of an FBAR. FBAR 30 is composed a pair of electrodes 32 and 34 and a piezoelectric element 36 between the electrodes. The piezoelectric element and electrodes are suspended over a cavity 44 defined in a substrate 42. This way of suspending the FBAR allows the FBAR to resonate mechanically in response to an electrical signal applied between the electrodes.

Above-mentioned U.S. patent application Ser. No. 10/699,289, of which this application is a Continuation-in-Part discloses a band-pass filter that incorporates a decoupled stacked bulk acoustic resonator (DSBAR) composed of a lower FBAR, an upper FBAR stacked on lower FBAR and an acoustic decoupler between the FBARs. Each of the FBARs is composed of a pair of electrodes and a piezoelectric element between the electrodes. An electrical input signal is applied between electrodes of the lower FBAR and the upper FBAR provides a band-pass filtered electrical output signal between its electrodes. The electrical input signal may alternatively be applied between the electrodes of the upper FBAR, in which case, the electrical output signal is taken from the electrodes of the lower FBAR.

Above-mentioned U.S. patent application Ser. No. 10/699,481, of which this disclosure is a Continuation-in-Part, discloses a film acoustically-coupled transformer (FACT) composed of two decoupled stacked bulk acoustic resonators (DSBARs). A first electrical circuit interconnects the lower FBARs of the DSBARs in series or in parallel. A second electrical circuit interconnects the upper FBARs of the DSBARs in series or in parallel. Balanced or unbalanced FACT embodiments having impedance transformation ratios of 1:1 or 1:4 can be obtained, depending on the configurations of the electrical circuits. Such FACTs also provide galvanic isolation between the first electrical circuit and the second electrical circuit.

The FBAR described above with reference to FIG. 2 and devices, such as ladder filters, DSBARs and FACTs, incorporating one or more FBARs will be referred to generically in this disclosure as FBAR devices.

Most FBAR devices have a frequency response having a band pass characteristic characterized by a center frequency. The constituent FBARs have a frequency response characteristic characterized by a resonant frequency. In practical embodiments of current FBAR devices in which the material of the piezoelectric element is aluminum nitride (AlN) and the material of the electrodes is molybdenum (Mo), the resonant frequency of the FBAR(s) has a temperature coefficient from about −20 ppm/° C. to about −35 ppm/° C. Such temperature coefficients reduce the temperature range over which the FBAR device incorporating the FBARs can meet its pass bandwidth specification. Such temperature coefficients additionally reduce manufacturing yield, because the bandwidth limits to which the FBAR devices are tested have to be inset to ensure that the FBAR device will meet its bandwidth specification over its entire operating temperature range.

What is needed, therefore, is an FBAR whose resonant frequency has a reduced temperature coefficient.

SUMMARY OF THE INVENTION

In a first aspect, the invention provides a temperature-compensated film bulk acoustic resonator (FBAR) device that comprises an FBAR stack. The FBAR stack comprises an FBAR and a temperature-compensating element. The FBAR is characterized by a resonant frequency having a temperature coefficient, and comprises opposed planar electrodes and a piezoelectric element between the electrodes. The piezoelectric element has a temperature coefficient on which the temperature coefficient of the resonant frequency depends at least in part. The temperature-compensating element has a temperature coefficient opposite in sign to the temperature coefficient of the piezoelectric element.

As a result of the opposite sign of its temperature coefficient, the temperature-compensating element reduces the effect of the temperature coefficient of the piezoelectric element, and typically additionally the effect of the temperature coefficient of electrodes, on the temperature coefficient of the FBAR device. As a result, the magnitude of the temperature coefficient of the FBAR device is less than that of a similar FBAR device without a temperature-compensating element.

The temperature-compensating element is typically structured as one or more temperature-compensating layers located in the FBAR stack. In one embodiment, a temperature-compensating layer is juxtaposed with one or both of the electrodes. For example, the temperature-compensating layer is located between the electrode and the piezoelectric element. In another embodiment, the temperature-compensating layer is on the other side of the electrode from the piezoelectric element. In another embodiment, the temperature-compensating layer is embedded in the piezoelectric element.

In another embodiment, one or both of the electrodes have a temperature coefficient opposite in sign to the piezoelectric element and provide the temperature-compensating element.

Examples of an FBAR device include an FBAR, such as an FBAR that provides an element of a ladder filter, a stacked bulk acoustic resonator (SBAR), a decoupled stacked bulk acoustic resonator (DSBAR), a band-pass filter, a coupled-resonator filter, and a film acoustically-coupled transformer (FACT).

In a second aspect, the invention provides an acoustic device comprising an acoustic propagation path having a propagation time-related property. The propagation time-related property has a temperature coefficient. The acoustic propagation path comprises an acoustic propagation element having a temperature coefficient on which the propagation time-related property of the acoustic propagation path depends at least in part. The acoustic propagation path additionally comprises a temperature-compensating element having a temperature coefficient opposite in sign to the temperature coefficient of the acoustic propagation element.

DETAILED DESCRIPTION

Figure 1:
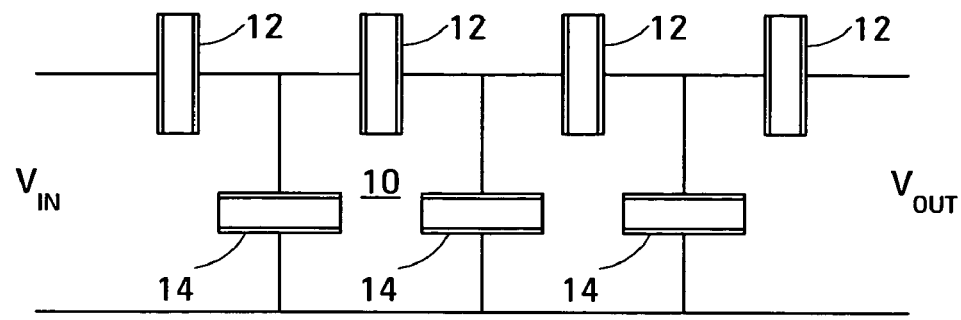
FIG. 1 is a schematic drawing of a ladder filter incorporating FBARs in accordance with the prior art.
Figure 2:
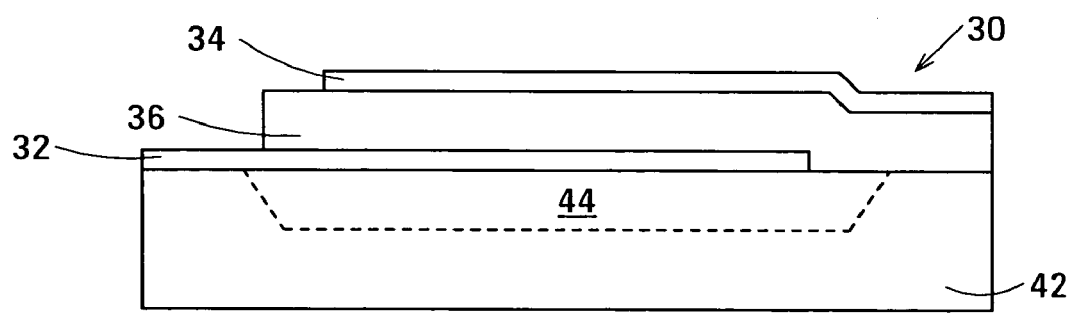
FIG. 2 is a cross-sectional view of an FBAR in accordance with the prior art.

As used in this disclosure, the term FBAR stack refers to a stack of layers of various materials that comprises one or more FBARs. In embodiments in which the FBAR stack comprises more than one FBAR, the FBARs may be at the same level in the FBAR stack or at different levels in the FBAR stack, or some of the FBARs may be at the same level in the FBAR stack and some of the FBARs may be at different levels in the FBAR stack. For example, the FBARs in an FBAR ladder filter are typically at the same level in the FBAR stack, the FBARs in a decoupled stacked bulk acoustic resonator (DSBAR) are at different levels in the FBAR stack and some of the FBARs of a thin-film acoustically-coupled transformer (FACT) are at the same level in the FBAR stack and some of the FBARs of the FACT are at different levels in the FBAR stack.

An FBAR has a resonant frequency that depends directly on the velocity of propagation of sound in the FBAR and that depends inversely on the thicknesses of the layers constituting the FBAR. The velocity of propagation in most of the materials from which FBARs are currently fabricated exhibit a negative temperature coefficient because the inter-atomic forces weaken with increasing temperature. A decrease in these forces results in a decrease in the elastic constant of the material with a concomitant decrease in the velocity of propagation. An increase in temperature causes the velocity of propagation to decrease, and also causes the layers to increase in thickness. Both of these effects tend to reduce the resonant frequency of the FBAR, resulting in the above-described negative temperature coefficient. For example, the temperature coefficients of aluminum nitride (AlN) and molybdenum (Mo) from which FBARs are currently fabricated are about −25 ppm/° C. and −60 ppm/° C., respectively.

The relationship between overall temperature coefficient of the resonant frequency of the FBAR and the temperature coefficients of the electrodes and piezoelectric element of the FBAR is determined by the relative thicknesses of the electrodes and the piezoelectric element. An FBAR-based duplexer has a receiver ladder filter in which the FBARs typically have relatively thin electrodes and a relatively thick piezoelectric element. The resonant frequency of such FBARs has a temperature coefficient similar to that of AlN, i.e., about −25 ppm/° C. The transmitter ladder filter of the FBAR-based duplexer typically has FBARs with relatively thick electrodes and a relatively thin piezoelectric element. The temperature coefficient of the molybdenum of the electrodes provides a greater contribution to the temperature coefficient of the resonant frequency of the FBAR. Consequently, the resonant frequency of such FBARs has a temperature coefficient in a range from about −35 ppm/° C. to about −40 ppm/° C.

In accordance with the invention, the FBAR stack additionally incorporates a temperature-compensating element that reduces the temperature coefficient of the resonant frequency of the FBAR device. The temperature-compensating element has a temperature coefficient opposite in sign to the piezoelectric element that is part of the FBAR stack, i.e., the temperature-compensating element has a positive temperature coefficient in the above example in which the piezoelectric element has a negative temperature coefficient. With the temperature-compensating element, the effective temperature coefficient $TC_{eff}$ of the FBAR becomes to a first approximation:

$$TC_{eff} = \{(TC_E * t_E) + (TC_P * t_P) + (TC_C * t_C)\} / (t_E + t_P + t_C) \quad (1)$$

where $TC_E$ is the temperature coefficient of the electrode material, $TC_P$ is the temperature coefficient of the material of the piezoelectric element, $TC_C$ is the temperature coefficient of temperature-compensating element, $t_E$ is the total thickness of the electrodes, $t_P$ is the thickness of the piezoelectric element and $t_C$ is the total thickness of the temperature-compensating element. The thicknesses are measured in the direction in which sound propagates through the elements during operation of the FBAR device. Equation (1) applies to both longitudinal and shear modes of propagation. Equation (1) ignores the second order effect of the acoustic impedances of the electrodes, piezoelectric element and temperature-compensating element on the temperature compensating effect of the temperature-compensating element.

Materials having propagation velocity with a positive temperature coefficient that are suitable for inclusion in an FBAR stack are relatively scarce but do exist. Some desirable properties of the temperature-compensating element include:

1. Insoluble or only slowly attacked by etchants used in processes following their deposition
2. A softening and/or decomposition temperature above the deposition temperature of the piezoelectric material (typically about 450° C. for AlN) if deposited before the piezoelectric element or above the deposition temperature of the electrode material (typically about 300° C. for Mo) otherwise.
3. Ability to adhere strongly to the materials of the electrodes and piezoelectric element.
4. Ability to be patterned by photolithography and to be etched by the same wet or dry etchants as the electrode material.
5. Ability to be vacuum deposited or sputtered in layers up to 1 μm thick
6. A relatively simple chemical composition, for example, a binary metal alloy or a binary inorganic compound.
7. A metal temperature-compensating element has a low magnetic permeability and a high electrical conductivity and can constitute all or part of an electrode.
8. An insulating temperature-compensating element has a low loss tangent.

Above all, in typical FBAR devices in which the resonant frequency of the FBARs has negative temperature coefficient, the propagation velocity of the temperature-compensating element has a positive temperature coefficient.

Figure 3A:
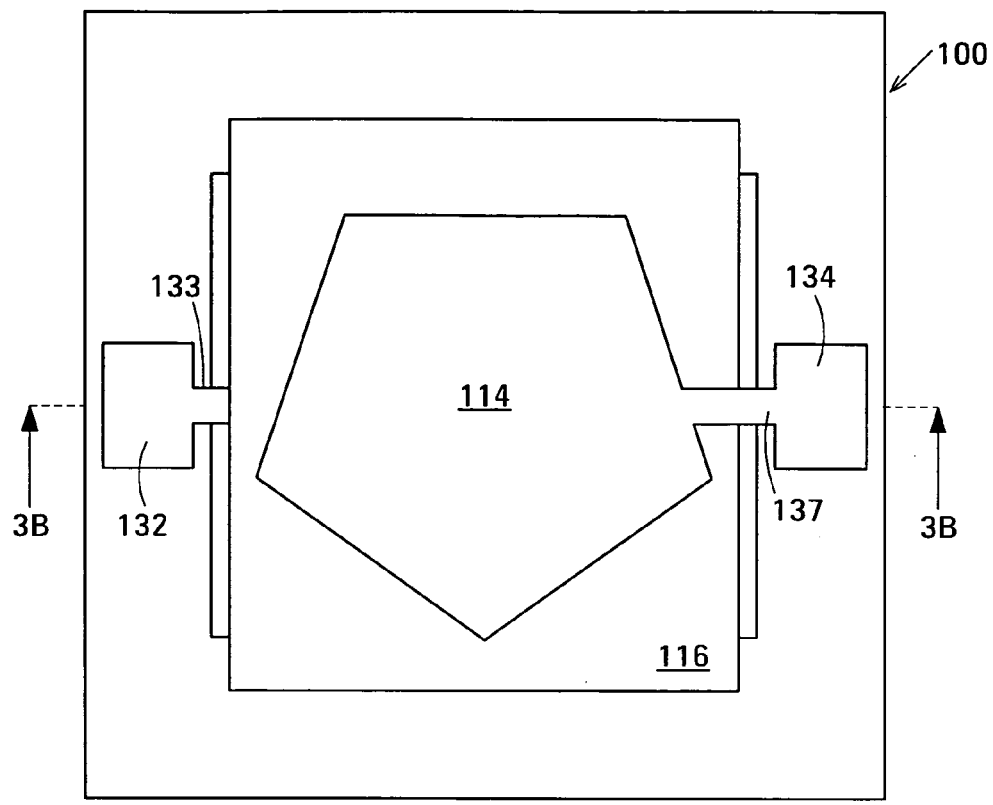
FIG. 3A is a plan view of a first embodiment of an FBAR device in accordance with the invention.
Figure 3B:
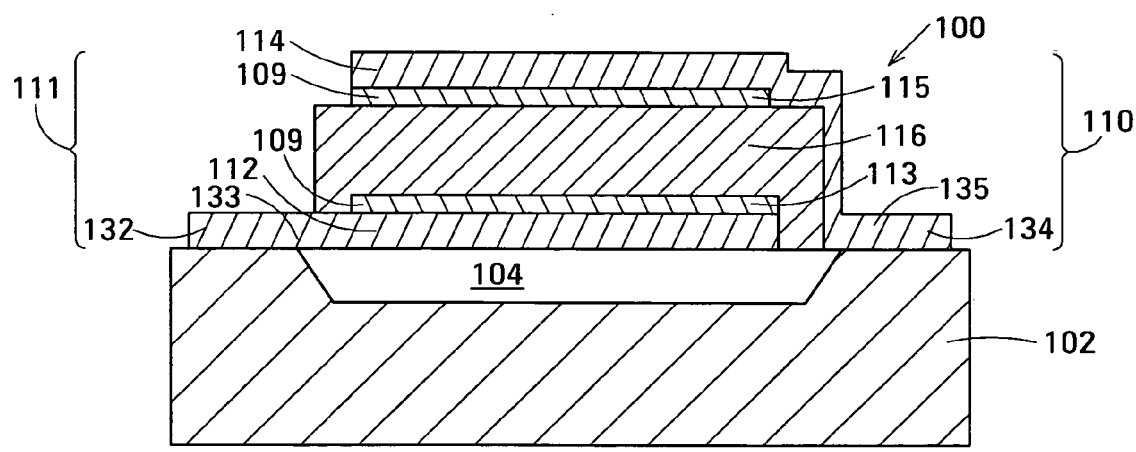
FIG. 3B is a cross-sectional view of the first embodiment of the FBAR device shown in FIG. 3A along the section line 3B-3B.

FIGS. 3A and 3B are respectively a plan view and a cross-sectional view of a first exemplary embodiment 100 of an FBAR device in accordance with the invention. FBAR device 100 comprises an FBAR stack comprising an FBAR. The FBAR is an exemplary FBAR of an FBAR ladder filter, such as the ladder filter shown in FIG. 1, or an exemplary FBAR of an FBAR duplexer. The remaining FBARs of such ladder filter or duplexer also constitute part of the FBAR stack. However, the remaining FBARs are omitted from FIGS. 3A and 3B to simplify the drawing.

FBAR device 100 comprises an FBAR stack 111. FBAR stack 111 comprises an FBAR 110 and a temperature-compensating element 109. FBAR 110 has opposed planar electrodes 112 and 114 and a piezoelectric element 116 between the electrodes. Piezoelectric element 116 has a temperature coefficient on which the temperature coefficient of the resonant frequency of the FBAR depends at least in part. The resonant frequency typically additionally depends on the temperature coefficient of the electrodes. Temperature-compensating element 109 has a temperature coefficient opposite in sign to the temperature coefficient of the piezoelectric element. As a result of the opposite sign of its temperature coefficient, temperature-compensating element 109 reduces the effect of the temperature coefficient of the piezoelectric element on the temperature coefficient of FBAR device 100. As a result, the magnitude of the temperature coefficient of FBAR device 100 is less than that of a similar FBAR device without the temperature-compensating element.

In the example shown in FIG. 3B, temperature-compensating element 109 is composed of a temperature-compensating layer 113 located between electrode 112 and piezoelectric element 116 and a temperature-compensating layer 115 located between electrode 114 and piezoelectric element 116. Temperature-compensating layers 113 and 115 are each a layer of a temperature-compensating material and have a temperature coefficient opposite in sign to the temperature coefficients of the piezoelectric element 116 and the electrodes 112 and 114 of FBAR 110. Using a temperature-compensating material that has a high electrical conductivity as the material of temperature-compensating layers 113 and 115 prevents the temperature-compensating layers from undesirably reducing the coupling constant of FBAR 110. In a typical embodiment of FBAR device 100, the piezoelectric element and the electrodes have a negative temperature coefficient and the temperature-compensating layers have a positive temperature coefficient.

As used in this disclosure, the temperature coefficient of a component of FBAR stack 111, e.g., temperature-compensating element 109, temperature-compensating layers 113 and 115, piezoelectric element 116 and electrodes 112 and 114, is the temperature coefficient of a parameter of the component on which the temperature coefficient of the resonant frequency of FBAR 110 depends. Typically, the parameter is a combination of the propagation velocity of sound in the component and the coefficient of thermal expansion of the component. The parameter may additionally take account of the acoustic impedance of the component.

In the example shown, temperature-compensating layers 113 and 115 constituting temperature-compensating element 109 have substantially the same shape and size as electrodes 112 and 114, respectively, in a plane parallel to the major surfaces of the layers. Also in the example shown, temperature-compensating layers 113 and 115 are juxtaposed with electrodes 112 and 114, respectively, and are located between electrode 112 and piezoelectric element 116 and between electrode 114 and piezoelectric element 116, respectively. Alternatively, temperature-compensating layers 113 and 115 are substantially the same shape and size as piezoelectric element 116.

Figure 3C:
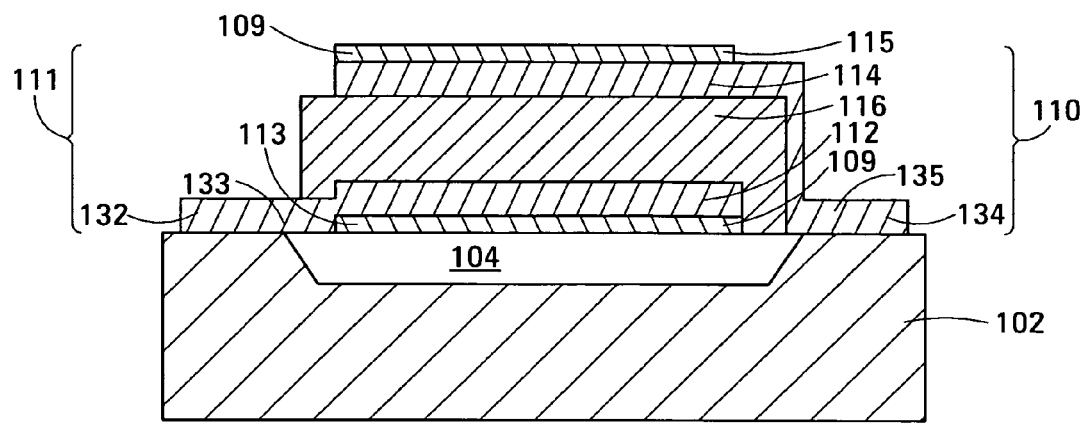
FIGS. 3C–3F are cross-sectional views of alternative structures of the temperature-compensating element of the FBAR device shown in FIG. 3A.

In another embodiment, temperature-compensating layers 113 and 115 are respectively located on the opposite sides of electrode 112 and electrode 114 from piezoelectric element 116, as shown in FIG. 3C. In embodiments in which the temperature-compensating layers are located outside the electric field applied to piezoelectric element 116 by a voltage difference between electrodes 112 and 114, the temperature-compensating material of temperature-compensating layers 113 and 115 may be electrically conducting or electrically insulating.

Figure 3D:
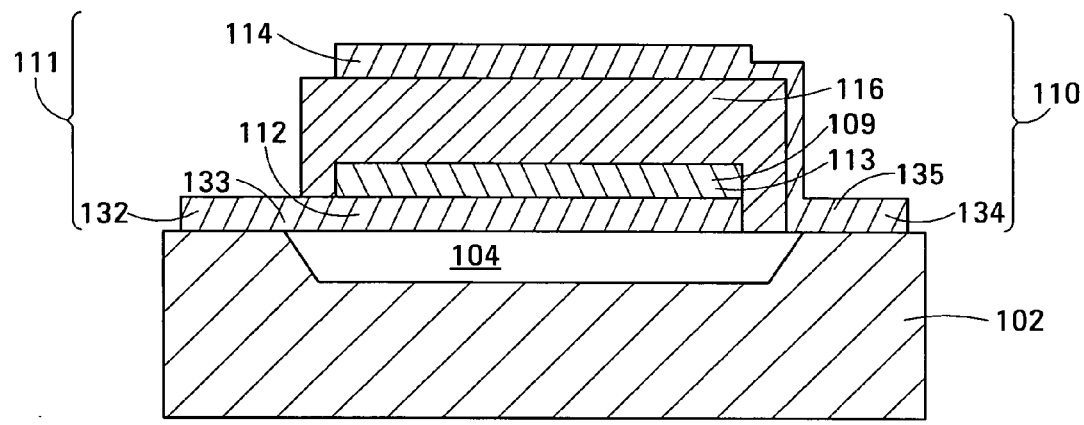

In another embodiment, temperature-compensating element 109 is composed of only a single temperature-compensating layer 113, as shown in FIG. 3D. Single temperature-compensating layer 113 has a thickness equal to the sum of the thicknesses of temperature-compensating layers 113 and 115 and is juxtaposed with electrode 112. In the example shown, the single temperature-compensating layer is located between electrode 112 and piezoelectric element 116. Using a temperature-compensating material that has a high to moderate electrical conductivity as the material of temperature-compensating layer 113 prevents the temperature-compensating layer from undesirably reducing the coupling constant of FBAR 110. The single temperature-compensating layer may alternatively be located on the opposite side of electrode 112 from piezoelectric element 116 in a manner similar to that shown in FIG. 3C. The single temperature-compensating element may alternatively be juxtaposed with electrode 114 in any of the ways just described with respect to electrode 112.

In the embodiment shown in FIG. 3D, the thickness of electrode 114 may be increased to restore the symmetry of FBAR device 100. However, increasing the thickness of electrode 114 increases the temperature coefficient that needs to be compensated by temperature-compensating element 109. Device asymmetry decreases the coupling constant, but such decreased coupling constant is typically acceptable.

Figure 3E:
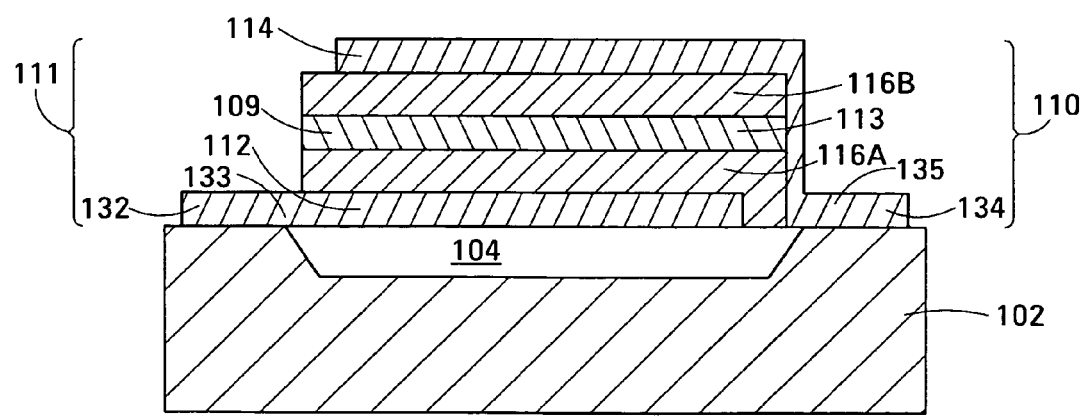

In another embodiment, temperature-compensating element 109 is composed of single temperature-compensating layer 113 embedded in piezoelectric element 116, as shown in FIG. 3E. This locates temperature-compensating layer 113 part-way through, e.g., half-way through, the thickness of piezoelectric element 116. Piezoelectric element 116 has two parts 116A and 116B between which temperature-compensating layer 113 is located. Using a temperature-compensating material that has a high to moderate electrical conductivity as the material of temperature-compensating layer 113 prevents the temperature-compensating layer from undesirably reducing the coupling constant of FBAR 110.

Temperature-compensating element 109 typically provides more effective temperature compensation in embodiments in which it is located between electrodes 112 and 114 than in embodiments, such as that shown in FIG. 3C, in which it located elsewhere.

Figure 3F:
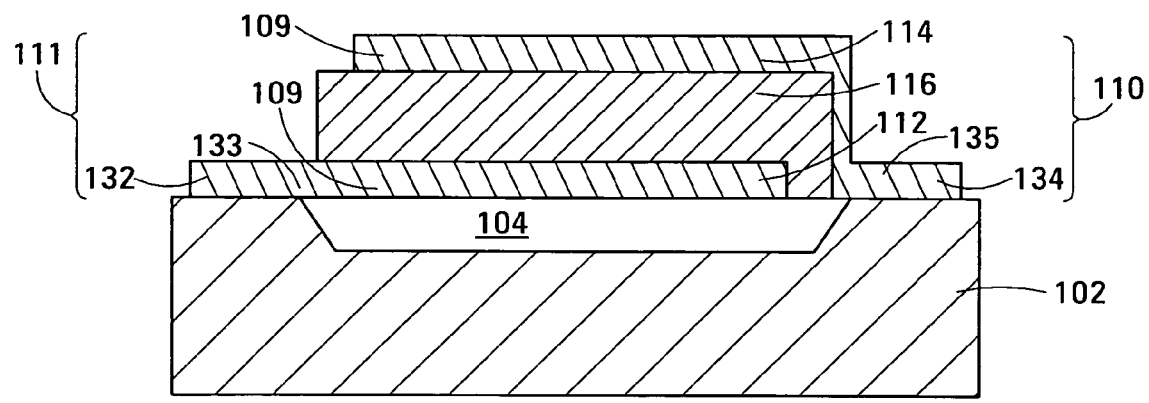

In another embodiment, temperature-compensating element 109 is composed of electrodes 112 and 114, as shown in FIG. 3F. In this embodiment, electrodes 112 and 114 have a temperature coefficient opposite in sign to that of piezoelectric element 116. The resonance frequency of embodiments of FBAR 110 in which the temperature coefficient of electrodes 112 and 114 is opposite in sign to the temperature coefficient of piezoelectric element 116 has a lower temperature coefficient than that of embodiments in which the temperature coefficient of the electrodes has the same sign as that of the piezoelectric element. In an alternative embodiment, temperature-compensating element 109 is composed of only one of the electrodes 112 and 114, and the material of the other of the electrodes is a conventional electrode material. Using a temperature-compensating material that has a high electrical conductivity as the material of electrodes 112 and 114 prevents the resistance of the electrodes from increasing the series resistance f FBAR 110.

In the above-described embodiments, temperature-compensating element 109 reduces the temperature coefficient of the resonant frequency of FBAR 110. The positive temperature coefficient of the propagation velocity of the temperature-compensating element offsets at least in part the negative temperature coefficient of the propagation velocity of the piezoelectric element and the electrodes. In some embodiments, the thickness of the temperature-compensating element is set such that the effective temperature coefficient of FBAR 110 is zero. In other embodiments, the thickness of the temperature-compensating element is set such that the effective temperature coefficient of FBAR 110 remains negative, but is substantially less than the temperature coefficient of a conventional FBAR device in which FBAR stack 111 has no temperature-compensating element. A reduction in the temperature coefficient of FBAR 110 will increase either or both of the operating temperature range and the manufacturing yield of FBAR 110. A useful increase in manufacturing yield is obtained simply by reducing the temperature coefficient of FBAR device 110 to one half of that of the conventional FBAR device.

In the example shown, FBAR device 100 additionally comprises a substrate 102. A cavity 104 is defined in substrate 102 and FBAR stack 111 is suspended over the cavity. Cavity 304 acoustically isolates FBAR stack 111 from substrate 102. FBAR stack 111 is therefore free to vibrate mechanically in response to an electrical signal applied between the electrodes 112 and 114 of FBAR 110. FBAR stack 111 may alternatively be isolated from substrate 102 by an acoustic Bragg reflector as disclosed by Lakin in U.S. Pat. No. 6,107,721. Acoustic Bragg reflectors composed of alternate metal Bragg layers and plastic Bragg layers that provide acoustic isolation comparable with that provided by cavity 104 using only one or two pairs of Bragg layers are described by Larson III et al. in U.S. patent application Ser. No. 10/969,744, entitled Cavity-less Film Bulk Acoustic Resonator (FBAR) Devices, assigned to the assignee of this application and incorporated by reference.

Elements described in this disclosure as juxtaposed typically physically contact one another as shown in FIG. 3B. However, juxtaposed elements may be separated by intervening elements provided such intervening elements have a negligible effect on the acoustical properties of the juxtaposed elements.

Temperature-compensating element 109 forms part of the acoustically-resonant structure of FBAR 110. To form an FBAR with a specified resonant frequency, the temperature-compensating element replaces part of one or more of the other components, i.e., the piezoelectric element and the electrodes, of the FBAR. Available temperature-compensating elements typically have electro-acoustic properties inferior to those of the other components of the FBAR. For example, typical metal temperature-compensating elements are higher in electrical resistivity than typical electrode materials. As a result, the temperature-compensating element has the potential to degrade the electro-acoustic properties of embodiments of FBAR 110 relative to those of a similar conventional FBAR device. The degradation can be minimized by using a temperature-compensating material with a large positive temperature coefficient as the material of the temperature-compensating element, since, in accordance with equation (1), this allows the thickness of the temperature-compensating element to be minimized. This minimizes the reduction in the thicknesses of the other components. Minimizing the thickness of the temperature-compensating element minimizes the effect of the temperature-compensating element on the electro-acoustic properties of the FBAR.

In one example, a receiver ladder filter incorporates an embodiment of FBAR 110 similar to that shown in FIG. 3B in which electrodes 112 and 114 are each a 110 nm-thick layer of molybdenum, piezoelectric element 116 is a 1.5 µm-thick layer of aluminum nitride and temperature-compensating layers 113 and 115 are each a 115 nm-thick layer of a temperature-compensating material having a temperature coefficient of +200 ppm/° C. Temperature-compensating layers 113 and 115 reduce the temperature coefficient of FBAR 110 to zero. The temperature-compensating layers additionally reduce the thickness coupling constant $k_t^2$ of FBAR device to 110 to about 5%. The coupling constant characterizes the efficiency with which the FBAR converts electrical energy into mechanical energy and should be as high as possible. For comparison, a conventional FBAR with the same nominal resonant frequency has a 2.2 µm-thick piezoelectric element, a temperature coefficient of about –25 ppm/° C. and thickness coupling constant $k_t^2$ of about 5.5%. In embodiment of FBAR 110 in which temperature-compensating material had a lower positive temperature coefficient, the temperature-compensating layers would be thicker than in the above example. Such thicker temperature-compensating layers could reduce the coupling constant below the level acceptable in the receiver ladder filter application.

In another example, a conventional transmitter ladder filter incorporates an FBAR in which electrodes 112 and 114 are each a 440 nm-thick layer of molybdenum and piezoelectric element 116 is a 760 nm-thick layer of aluminum nitride. Transmitter filters can experience high RF power and need an extra resonant frequency budget to allow for the resultant RF heating. Transmitter filters usually need lower effective coupling constant to achieve the specified roll-off. This is achieved by making the electrodes thicker. Thick electrodes of conventional electrode materials have the undesirable effect of increasing the temperature coefficient of the FBAR. However, in accordance with the invention, the electrodes are made of the temperature-compensating material instead of molybdenum, as shown in FIG. 3F. This provides the double advantage of lowering the effective coupling constant and reducing the temperature coefficient of the FBAR.

The above embodiments of FBAR 100 can be regarded an example of an acoustic device comprising an acoustic propagation path that has a propagation time-related property having a temperature coefficient. The propagation path is composed of one or more acoustic propagation elements. The acoustic propagation elements collectively have a temperature coefficient that determines the temperature coefficient of the propagation time-related property at least in part. The propagation path is additionally composed of a temperature-compensating element having a temperature coefficient opposite in sign to the temperature coefficient of the acoustic propagation elements. As used in this disclosure, the terms acoustic and sound encompass a much broader range of vibrational frequencies than the audio frequency range.

In the example shown in FIG. 3B, the propagation time-related property is the resonant frequency of FBAR 110. The acoustic propagation path extends from electrode 112 to electrode 114 and the acoustic propagation elements are electrode 112, electrode 114 and piezoelectric element 116. The acoustic propagation elements collectively have a temperature coefficient that causes the propagation time-related property of the acoustic propagation path to have a negative temperature coefficient. Also included in the acoustic propagation path is temperature-compensating element 109. Temperature-compensating element 109 has a positive temperature coefficient, opposite in sign to that of the acoustic propagation elements. Temperature-compensating element 109 reduces the magnitude of the temperature coefficient of the propagation time-related property of the acoustic propagation path. In the embodiment shown in FIG. 3C, the acoustic propagation path extends from temperature-compensating layer 113 to temperature-compensating layer 115.

Other examples of the above-described acoustic device include surface acoustic wave (SAW) filters, crystal filters, coupled-resonator filters and delay lines.

Figure 4A:
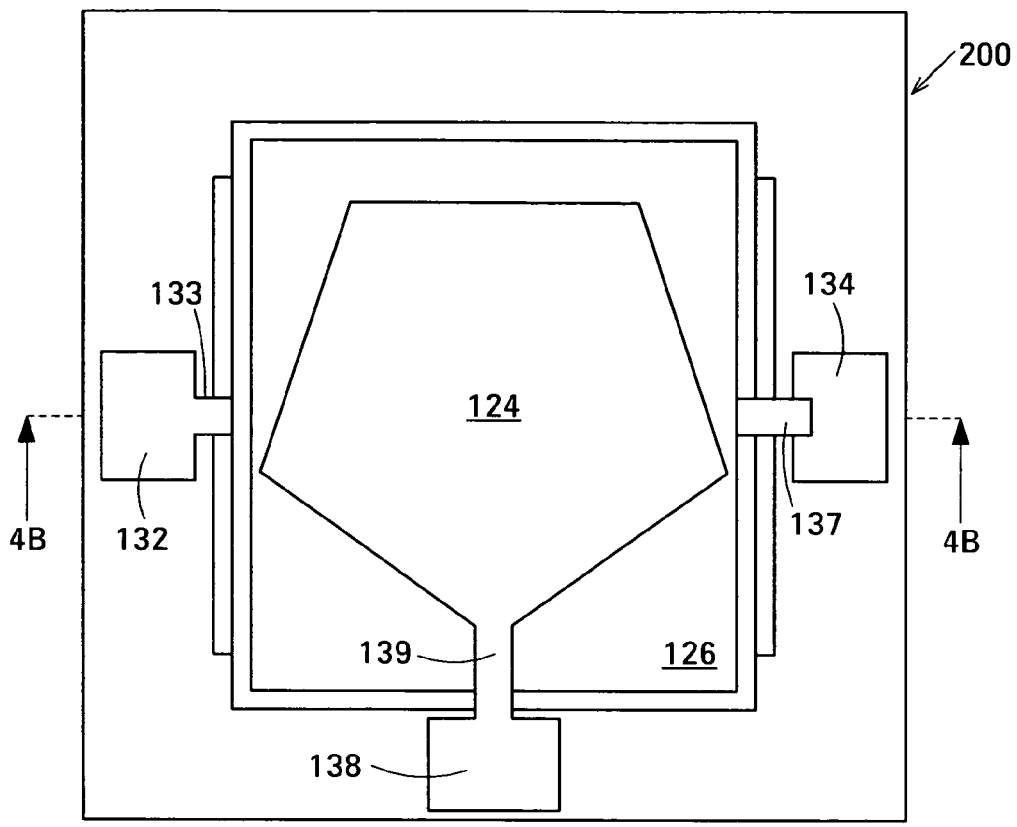
FIG. 4A is a plan view of a second embodiment of an FBAR device in accordance with the invention.
Figure 4B:
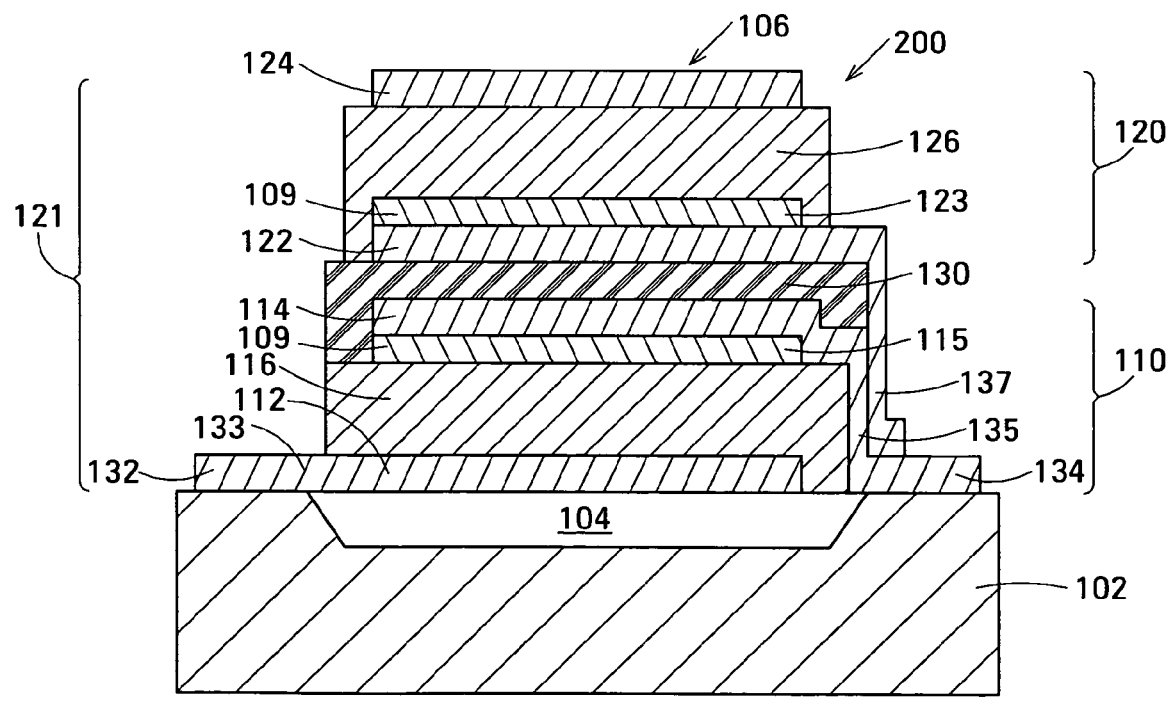
FIG. 4B is a cross-sectional view of the second embodiment of the FBAR device shown in FIG. 4A along the section line 4B—4B.

FIGS. 4A and 4B are respectively a plan view and a cross-sectional view of a second exemplary embodiment 200 of an FBAR device in accordance with the invention. FBAR device 200 is a band-pass filter in which the FBAR stack is composed of two FBARs and an acoustic decoupler between the FBARs. The FBARs and the acoustic decoupler constitute a single decoupled stacked bulk acoustic resonator (DSBAR).

FBAR device 300 comprises an FBAR stack 211. FBAR stack 211 comprises FBAR 110, described above, and temperature-compensating element 109. FBAR 110 is a lower FBAR in the FBAR stack. FBAR stack 211 additionally comprises an upper FBAR 120 stacked on lower FBAR 110 and an acoustic decoupler 130 between the FBARs.

Lower FBAR 110 has opposed planar electrodes 112 and 114 and a piezoelectric element 116 between the electrodes. Piezoelectric element 116 has a temperature coefficient on which the temperature coefficient of the resonant frequency of FBAR 110 depends at least in part. The resonant frequency of FBAR 110 typically additionally depends on the temperature coefficient of electrodes 112 and 114. Upper FBAR 120 has opposed planar electrodes 122 and 124 and a piezoelectric element 126 between the electrodes. Piezoelectric element 126 has a temperature coefficient on which the temperature coefficient of the resonant frequency of FBAR 120 depends at least in part. The resonant frequency of FBAR 120 typically additionally depends on the temperature coefficient of electrodes 122 and 124. Temperature-compensating element 109 has a temperature coefficient opposite in sign to the temperature coefficient of piezoelectric elements 116 and 126.

As a result of the opposite sign of its temperature coefficient, temperature-compensating element 109 reduces the effect of the temperature coefficient of piezoelectric elements 116 and 126, and typically additionally the effect of the temperature coefficient of electrodes 112, 114, 122 and 124, on the temperature coefficient of FBAR device 200. As a result, the magnitude of the temperature coefficient of FBAR device 200 is less than that of a similar FBAR device without a temperature-compensating element.

In the example shown in FIG. 4B, temperature-compensating element 109 is composed of temperature-compensating layer 115 located in FBAR 110 between electrode 114 and piezoelectric element 116 and a temperature-compensating layer 123 located in FBAR 120 between electrode 122 and piezoelectric element 126. Temperature-compensating layers 115 and 123 are each a layer of the above-described temperature-compensating material having a temperature coefficient opposite in sign to piezoelectric elements 116 and 126. In a typical embodiment of FBAR device 200, the piezoelectric elements 116 and 126 each have a negative temperature coefficient and the temperature-compensating element has a positive temperature coefficient.

Alternatively, temperature-compensating element 109 may be composed of temperature-compensating layers located in FBAR stack 211 relative to FBARs 110 and 120 in any of the configurations described above with reference to FIGS. 3B–3F. However, an embodiment of temperature-compensating element 109 in which temperature-compensating layers 115 and 123 are respectively juxtaposed with electrode 114 of FBAR 110 and with electrode 122 of FBAR 120, and these electrodes 114 and 122 are additionally juxtaposed with acoustic decoupler 130, as shown in FIG. 4B, is typically more effective at providing temperature compensation than other embodiments of the temperature-compensating element.

In FBAR device 200, acoustic decoupler 130 is located between FBARs 110 and 120, specifically, between electrode 114 of FBAR 110 and electrode 122 of FBAR 120. The acoustic decoupler controls the coupling of acoustic energy between FBARs 110 and 120. The acoustic decoupler couples less acoustic energy between the FBARs than would be coupled by direct contact between the FBARs. In the example shown in FIG. 6B, acoustic decoupler 130 is composed of an acoustic decoupling layer of acoustic decoupling material.

In the example shown, FBAR stack 211 is suspended over cavity 104 defined in substrate 102. Cavity 104 acoustically isolates FBAR stack 211 from substrate 102. The acoustic isolation between FBAR stack 211 and substrate 102 allow the FBARs 110 and 120 constituting DSBAR 106 to resonate mechanically in response to an input electrical signal applied between the electrodes of one of them. The acoustic energy generated in the FBAR that receives the input electrical signal passes through acoustic decoupler 130 into the other FBAR. The FBAR receiving the acoustic energy converts part of the acoustic energy into an electrical output signal provided between its electrodes. The electrical signal output between the electrodes of the FBAR receiving the acoustic energy has a band-pass frequency response characteristic substantially free of undesirable spurious artifacts arising from undesirable acoustic coupling between FBAR stack 211 and substrate 102.

In the example shown, the electrodes 112 and 114 of FBAR 110 are electrically connected to terminal pads 132 and 134, respectively, by electrical traces 133 and 135, respectively. Additionally, the electrodes 122 and 124 of FBAR 120 are electrically connected to terminal pads 134 and 138, respectively, by electrical traces 137 and 139. In an embodiment that provides electrical isolation between input and output, electrical trace 137 is connected to an additional terminal pad (not shown) instead of to terminal pad 134. Terminal pads 132, 134 and 138 are used to make electrical connections from FBAR device 200 to external electrical circuits (not shown).

In the example shown, acoustic decoupler 130 is a quarter-wave layer of acoustic decoupling material. The acoustic impedance of the acoustic decoupling material is less that of the materials of FBARs 110 and 120 and is substantially greater than that of air. The acoustic impedance of a material is the ratio of stress to particle velocity in the material and is measured in Rayleighs, abbreviated as rayl. The acoustic impedances of the materials of the FBARs are typically greater than 30 Mrayl (35 Mrayl for AlN and 63 Mrayl for Mo) and the acoustic impedance of air is about 1 krayl. In embodiments of FBAR device 200 in which the materials of FBARs 110, 120 are as stated above, acoustic decoupling materials with an acoustic impedance in the range from about 2 Mrayl to about 8 Mrayl work well as the acoustic coupling material of acoustic decoupler 130.

A quarter-wave layer has a nominal thickness t equal to an odd integral multiple of one quarter of the wavelength $\lambda_n$ in the acoustic decoupling material of an acoustic signal equal in frequency to the center frequency of the pass band of FBAR device 200, i.e., $t \approx (2m+1)\lambda_n/4$, where t and $\lambda_n$ are as defined above and m is an integer equal to or greater than zero. In an embodiment, the value of integer m is zero, i.e., $t \approx \lambda_n/4$. The frequency response of an embodiment of FBAR device 200 having an acoustic decoupler in which the value of integer m is zero is less likely to exhibit spurious artifacts than an embodiment having an acoustic decoupler in which the value of integer m is greater than zero. The frequency response the latter embodiment in which the value of integer m is greater than zero is more likely to exhibit spurious artifacts due to the ability of the thicker acoustic decoupler to support multiple acoustic modes.

Embodiments of acoustic decoupler 130 that differ in thickness from the nominal quarter-wave thickness by approximately ±10% of $\lambda_n/4$ can alternatively be used. A thickness tolerance outside this range can be used with some degradation in performance. However, acoustic decoupler 130 should differ significantly in thickness from an integral multiple of $\lambda_n/2$.

Many plastic materials have acoustic impedances in the above-described range from about 2 Mrayl to about 8 Mrayl and can be applied in layers of uniform thickness in the thickness ranges stated above. Such plastic materials are therefore potentially suitable for use as the acoustic decoupling material of acoustic decoupler 130. However, the acoustic decoupling material must also be capable of withstanding the temperatures of the fabrication operations performed after acoustic decoupler 130 has been fabricated. As will be described in more detail below, in practical embodiments of FBAR device 200, electrodes 122 and 124 and piezoelectric layer 126 are deposited by sputtering after acoustic decoupler 130 has been fabricated. Temperatures as high as 400° C. are reached during these deposition processes. Thus, a plastic that remains stable at such temperatures is used as the acoustic decoupling material.

Plastic materials typically have a very high acoustical attenuation per unit length compared with the other materials of FBARs 110 and 120. However, since the plastic acoustic decoupler 130 is typically less than 1 µm thick, e.g., 200 nm thick, the acoustic attenuation introduced by such embodiment of acoustic decoupler 130 is typically negligible.

In one embodiment, a polyimide is used as the acoustic decoupling material of acoustic decoupler 130. Polyimide is sold under the trademark Kapton® by E. I. du Pont de Nemours and Company. In such embodiment, acoustic decoupler 130 is composed of a quarter-wave layer of polyimide applied to electrode 114 by spin coating. Polyimide has an acoustic impedance of about 4 Mrayl.

In another embodiment, a poly(para-xylylene) is used as the acoustic decoupling material of acoustic decoupler 130. In such embodiment, acoustic decoupler 130 is composed of a quarter-wave layer of poly(para-xylylene) applied to electrode 114 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In another embodiment, a crosslinked polyphenylene polymer is used as the acoustic decoupling material of acoustic decoupler 130. In such embodiment, acoustic decoupler 130 is a quarter-wave layer of a crosslinked polyphenylene polymer applied by spin coating. Crosslinked polyphenylene polymers have been developed as low dielectric constant dielectric materials for use in integrated circuits and consequently remain stable at the high temperatures to which acoustic decoupler 130 is subject during the subsequent fabrication of FBAR 120. The inventors have discovered that crosslinked polyphenylene polymers additionally have a calculated acoustic impedance of about 2 Mrayl. This acoustic impedance is in the range of acoustic impedances that provides FBAR device 200 with a useful pass bandwidth.

Precursor solutions containing various oligomers that polymerize to form respective crosslinked polyphenylene polymers are sold by The Dow Chemical Company, Midland, Mich., under the trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., *Development of Low-Dielectric Constant Polymer for the Fabrication of Integrated Circuit Interconnect,* 12 ADVANCED MATERIALS, 1769 (2000), also incorporated by reference. Compared with polyimide, crosslinked polyphenylene polymers have a lower acoustic impedance, a lower acoustic attenuation and a lower dielectric constant. Moreover, a spun-on layer of the precursor solution is capable of producing a high-quality film of the crosslinked polyphenylene polymer with a thickness of the order of 200 nm, which is a typical thickness of acoustic decoupler 130.

In an alternative embodiment, acoustic decoupler 130 is composed of acoustic decoupling layers (not shown) of acoustic decoupling materials having different acoustic impedances as described in the above-mentioned U.S. patent application Ser. No. 10/965,449 of John D. Larson III and Stephen Ellis entitled Pass Bandwidth Control in Decoupled Stacked Bulk Acoustic Resonator Devices. The acoustic impedances and thicknesses of the acoustic decoupling layers collectively define the acoustic impedance of acoustic decoupler 130. The acoustic impedance of the acoustic decouplers in turn defines the pass bandwidth of FBAR device 200. The embodiment of acoustic decoupler 130 composed of acoustic decoupling layers of acoustic decoupling materials having different acoustic impedances is structured to impose a nominal phase change of all odd integral multiple of $\pi/2$ radians on an acoustic signal equal in frequency to the center frequency of the pass band of FBAR device 200. In an embodiment, the acoustic decoupler is structured to impose a nominal phase change of $\pi/2$ radians on an acoustic signal equal in frequency to the center frequency. This phase change is equal to the nominal phase change imposed by an acoustic decoupler composed of a single layer of acoustic decoupling material having a nominal thickness equal to one quarter of the wavelength in the acoustic decoupling material of an acoustic signal equal in frequency to the center frequency.

In an example, acoustic decoupler 130 was composed of an acoustic decoupling layer of a crosslinked polyphenylene polymer having an acoustic impedance of about 2 Mrayl atop an acoustic decoupling layer of polyimide having an acoustic impedance of about 4 Mrayl. Such acoustic decoupler provides an embodiment of FBAR device 200 with a pass bandwidth intermediate between the pass bandwidths of embodiments in which the acoustic decouplers are composed of single quarter-wave layer of polyimide or single quarter-wave layer of the crosslinked polyphenylene polymer.

In an alternative embodiment, the acoustic impedance of the acoustic decoupling material of acoustic decoupler 130 is substantially greater than that of the materials of FBARs 110 and 120. No acoustic decoupling materials having this property are known at this time, but such materials may become available in future. Alternatively, FBAR materials with lower acoustic impedances may become available in future. The thickness of acoustic decoupler 130 of such high acoustic impedance acoustic decoupling material is as described above.

In another embodiment (not shown), acoustic decoupler 130 is structured as a Bragg structure composed of a low acoustic impedance Bragg element sandwiched between high acoustic impedance Bragg elements. The low acoustic impedance Bragg element is a layer of a low acoustic impedance material whereas the high acoustic impedance Bragg elements are each a layer of high acoustic impedance material. The acoustic impedances of the Bragg elements are characterized as "low" and "high" with respect to one another and additionally with respect to the acoustic impedance of the piezoelectric material of piezoelectric elements 116 and 126. At least one of the Bragg elements additionally has a high electrical resistivity and a low dielectric permittivity to provide electrical isolation between input and output of FBAR device 200.

Each of the layers constituting the Bragg element is nominally a quarter-wave layer. Layers that differ from the nominal quarter-wave thickness by approximately ±10% of one quarter of the wavelength can alternatively be used. A thickness tolerance outside this range can be used with some degradation in performance, but the thickness of the layers should differ significantly from an integral multiple of one-half of the wavelength.

In an embodiment, the low acoustic impedance Bragg element is a layer of silicon dioxide ($SiO_2$), which has an acoustic impedance of about 13 Mrayl, and each of the high acoustic impedance Bragg elements is a layer of the same material as electrodes 114 and 122, e.g., molybdenum, which has an acoustic impedance of about 63 Mrayl. Using the same material for the high acoustic impedance Bragg elements and the electrodes of FBARs 110 and 120 allows the high acoustic impedance Bragg elements additionally to serve as the electrodes of the FBARs adjacent the acoustic coupling elements.

Figure 5A:
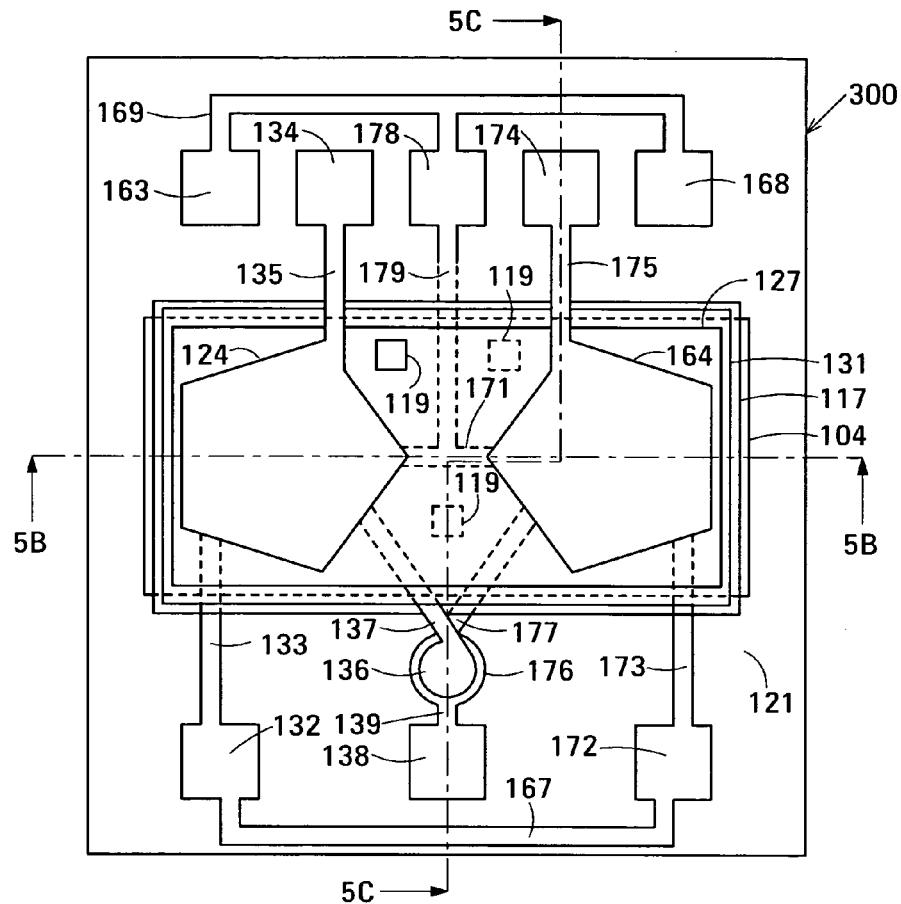
FIG. 5A is a plan view of a third embodiment of an FBAR device in accordance with the invention.
Figure 5B:
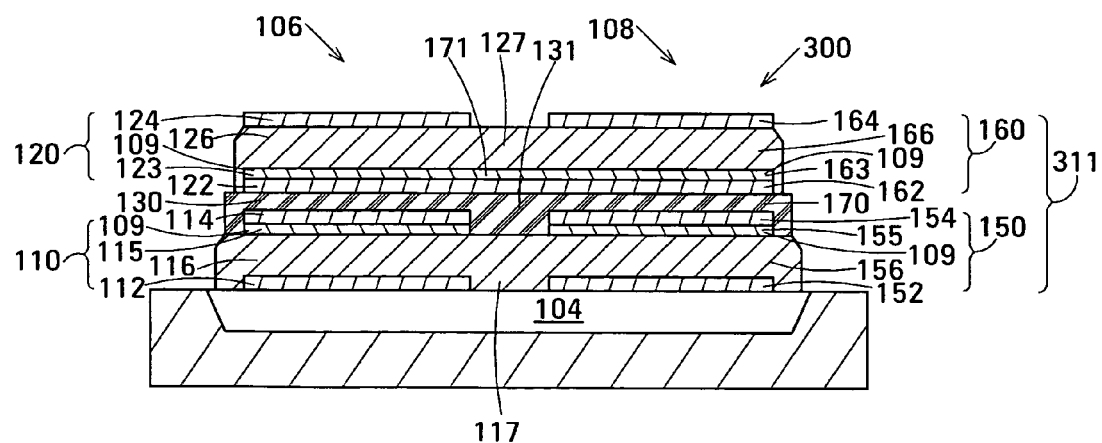
FIG. 5B is a cross-sectional view of the third embodiment of the FBAR device shown in FIG. 5A along the section line 5B—5B.
Figure 5C:
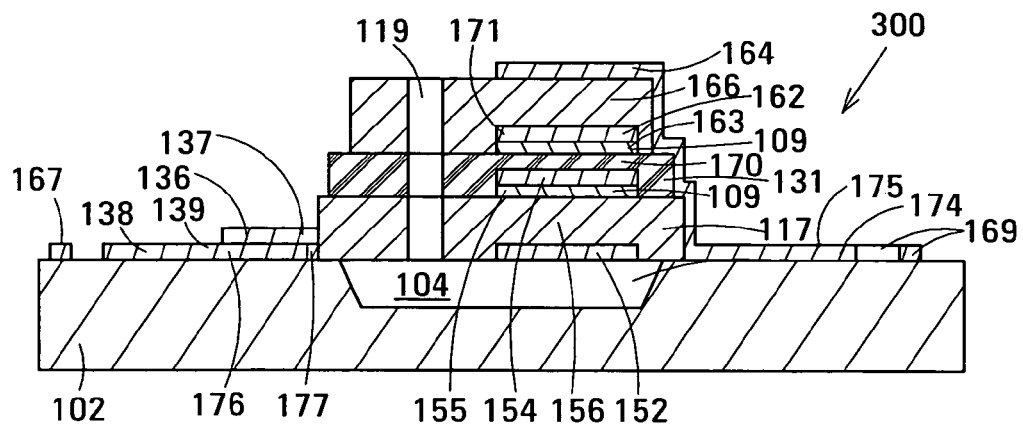
FIG. 5C is a cross-sectional view of the third embodiment of the FBAR device shown in FIG. 5A along the section line 5C—5C.
Figure 5D:
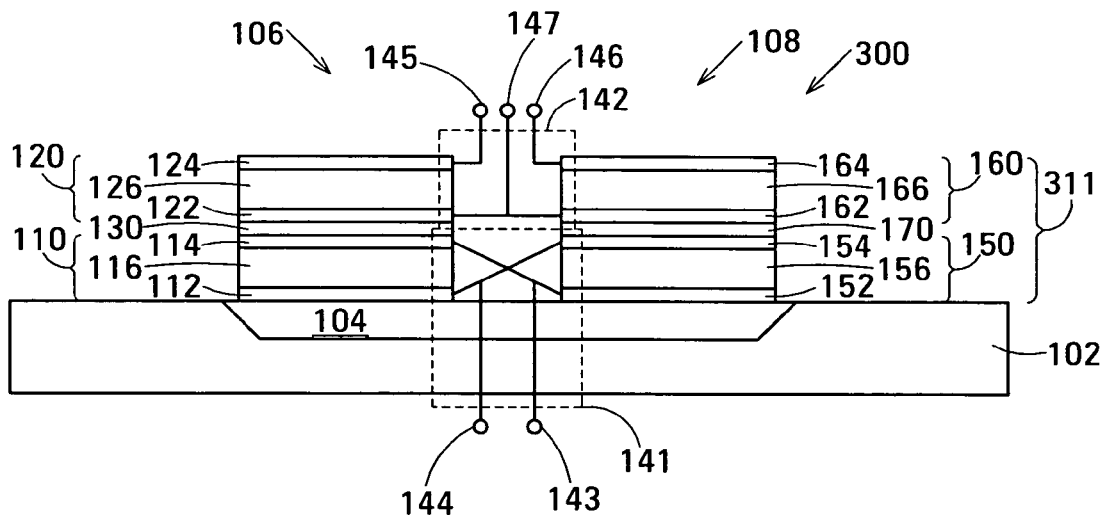
FIG. 5D is a schematic diagram of the electrical circuits of the third embodiment of the FBAR device shown in FIG. 5A.

FIG. 5A is a plan view of a third exemplary embodiment 300 of an FBAR device in accordance with the invention. FBAR device 300 is a film acoustically-coupled transformer (FACT) in which the FBAR stack is composed of four FBARs arranged as two decoupled stacked bulk acoustic resonators (DSBARs). FIGS. 5B and 5C are cross-sectional views along the section lines 5B—5B and 5C—5C, respectively, in FIG. 5A. FIG. 5D is a schematic drawing of the electrical circuits of the example of FACT 300 shown in FIG. 5A and described below.

FBAR device 300 comprises an FBAR stack 311. FBAR stack 311 comprises an FBAR 110, described above, and temperature-compensating element 109. FBAR 110 is a lower FBAR in the FBAR stack. FBAR stack 311 additionally comprises an upper FBAR 120 stacked on lower FBAR 110 and an acoustic decoupler 130 between FBARs 110 and 120. FBAR 110, FBAR 120 and acoustic decoupler 130 constitute the above-described DSBAR 106. FBAR stack 311 additionally comprises a second DSBAR 108 composed of lower FBAR 150, upper FBAR 160 stacked on lower FBAR 150 and an acoustic decoupler 170 between FBARs 150 and 160. FBAR 110 has opposed planar electrodes 112 and 114 and a piezoelectric element 116 between the electrodes.

FACT 300 is additionally composed of an electrical circuit that interconnects the lower FBARs 110 and 150 of DSBARs 106 and 108, respectively, and an electrical circuit that interconnects the upper FBARs 120 and 160 of DSBARs 106 and 108, respectively. FIG. 5D shows an example in which an electrical circuit 141 connects the lower FBAR 110 of DSBAR 106 and the lower FBAR 150 of DSBAR 108 in anti-parallel, and an electrical circuit 142 connects the upper FBAR 120 of DSBAR 106 and the upper FBAR 160 of DSBAR 108 in series.

In DSBAR 106, lower FBAR 110 is composed of opposed planar electrodes 112 and 114 and a piezoelectric element 116 between the electrodes. Piezoelectric element 116 has a temperature coefficient on which the temperature coefficient of the resonant frequency of FBAR 110 depends at least in part. The resonant frequency of FBAR 110 typically additionally depends on the temperature coefficient of electrodes 112 and 114. Upper FBAR 120 is composed of opposed planar electrodes 122 and 124 and a piezoelectric element 126 between the electrodes. Upper FBAR 120 has opposed planar electrodes 122 and 124 and a piezoelectric element 126 between the electrodes. Piezoelectric element 126 has a temperature coefficient on which the temperature coefficient of the resonant frequency of FBAR 120 depends at least in part. The resonant frequency of FBAR 120 typically additionally depends on the temperature coefficient of electrodes 122 and 124. Temperature-compensating element 109 has a temperature coefficient opposite in sign to the temperature coefficient of piezoelectric elements 116 and 126.

In DSBAR 108, lower FBAR 150 is composed of opposed planar electrodes 152 and 154 and a piezoelectric element 156 between the electrodes. Piezoelectric element 156 has a temperature coefficient on which the temperature coefficient of the resonant frequency of FBAR 150 depends at least in part. The resonant frequency of FBAR 150 typically additionally depends on the temperature coefficient of electrodes 152 and 154. Upper FBAR 160 is composed of opposed planar electrodes 162 and 164 and a piezoelectric element 166 between the electrodes. Piezoelectric element 166 has a temperature coefficient on which the temperature coefficient of the resonant frequency of FBAR 160 depends at least in part. The resonant frequency of FBAR 160 typically additionally depends on the temperature coefficient of electrodes 162 and 164. Temperature-compensating element 109 has a temperature coefficient opposite in sign to the temperature coefficient of piezoelectric elements 156 and 166.

As a result of the opposite sign of its temperature coefficient, temperature-compensating element 109 reduces the effect of the temperature coefficient of piezoelectric elements 116, 126, 156 and 166, and typically additionally the effect of the temperature coefficient of electrodes 112, 114, 122, 124, 152, 154, 162 and 166, on the temperature coefficient of FBAR device 300. As a result, the magnitude of the temperature coefficient of FBAR device 300 is less than that of a similar FBAR device without a temperature-compensating element.

In the example shown in FIG. 5B, temperature-compensating element 109 is composed of temperature-compensating layer 115 located in FBAR 110 between electrode 114 and piezoelectric element 116, temperature-compensating layer 123 located in FBAR 120 between electrode 122 and piezoelectric element 126, temperature-compensating layer 155 located in FBAR 150 between electrode 154 and piezoelectric element 156 and temperature-compensating layer 163 located in FBAR 160 between electrode 162 and piezoelectric element 166. Temperature-compensating layers 115, 123, 155 and 163 are each a layer of the above-described temperature-compensating material having a temperature coefficient opposite in sign to that of piezoelectric elements 116, 126, 156 and 166. In a typical embodiment of FBAR device 300, the piezoelectric elements 116, 126, 156 and 166 each have a negative temperature coefficient and the temperature-compensating element has a positive temperature coefficient.

Alternatively, temperature-compensating element 109 may be composed of temperature-compensating layers located in FBAR stack 311 relative to FBARs 110, 120, 150 and 160 in any of the configurations described above with reference to FIGS. 3B–3F. However, an embodiment of temperature-compensating element 109 in which temperature-compensating layers 115 and 123 are respectively juxtaposed with electrode 114 of FBAR 110 and with electrode 122 of FBAR 120, and electrodes 114 and 122 are additionally juxtaposed with acoustic decoupler 130, and in which temperature-compensating layers 155 and 163 are respectively juxtaposed with electrode 154 of FBAR 150 and with electrode 162 of FBAR 160, and electrodes 154 and 162 are additionally juxtaposed with acoustic decoupler 170, as shown in FIG. 5B, is typically more effective at providing temperature compensation than other embodiments of the temperature-compensating element.

In FACT 300, acoustic decoupler 130 of DSBAR 106 is located between lower FBAR 110 and upper FBAR 120; specifically, between electrode 114 of lower FBAR 110 and electrode 122 of upper FBAR 120. Acoustic decoupler 130 controls the coupling of acoustic energy between FBARs 110 and 120. Acoustic decoupler 130 couples less acoustic energy between the FBARs 110 and 120 than would be coupled if the FBARs were in direct contact with one another as they would be in a conventional stacked bulk acoustic resonator (SBAR). Additionally, acoustic decoupler 170 of DSBAR 108 is located between FBARs 150 and 160; specifically, between electrode 154 of lower FBAR 150 and electrode 162 of upper FBAR 160. Acoustic decoupler 170 controls the coupling of acoustic energy between FBARs 150 and 160. Acoustic decoupler 170 couples less acoustic energy between the FBARs 150 and 160 than would be coupled if the FBARs were in direct contact with one another. The coupling of acoustic energy defined by acoustic decouplers 130 and 170 determines the pass bandwidth of FACT 300.

In the example shown in FIGS. 5A–5C, acoustic decouplers 130 and 170 are respective parts of an acoustic decoupling layer 131. In other embodiments, acoustic decouplers 130 and 170 are each composed of acoustic decoupling layers of acoustic decoupling materials having different acoustic impedances, as described in U.S. patent application Ser. No. 10/965,449 of John D. Larson et al., entitled Pass Bandwidth Control in Decoupled Stacked Bulk Acoustic Resonator Devices assigned to the assignee of this disclosure and incorporated by referenee. In other embodiments, acoustic decouplers 130 and 170 are structurally independent.

FIG. 5D schematically shows an example of the electrical circuits that interconnect DSBARs 106 and 108 and connect DSBARs 106 and 108 to external electrical circuits (not shown). Electrical circuit 141 connects lower FBARs 110 and 150 in anti-parallel and to signal terminal 143 and ground terminal 144. In the embodiment shown in FIGS. 5A–5C, terminal pad 138 provides signal terminal 143 and terminal pads 132 and 172 provide ground terminal 144. In the embodiment, electrical circuit 141 is provided by an electrical trace 133 that extends from terminal pad 132 to electrode 112 of FBAR 110, an electrical trace 137 that extends from electrode 114 of FBAR 110 to an interconnection pad 136 in electrical contact with an interconnection pad 176, an electrical trace 139 that extends from interconnection pad 176 to signal pad 138, an electrical trace 177 that extends from interconnection pad 176 to electrode 152 of FBAR 150, an electrical trace 173 that extends from electrode 154 of FBAR 150 to terminal pad 172 and an electrical trace 167 that interconnects terminal pads 132 and 172.

In the exemplary electrical schematic shown in FIG. 5D, electrical circuit 142 connects upper FBARs 120 and 160 in series and to signal terminals 145 and 146 and to optional center-tap terminal 147. In the embodiment shown in FIGS. 5A–5C, terminal pads 134 and 174 provide signal pads 145 and 146 and terminal pad 178 provides center-tap terminal 147. In the embodiment, electrical circuit 142 is provided by an electrical trace 135 that extends from terminal pad 134 to electrode 124 of FBAR 120, an electrical trace 171 that extends from electrode 122 of FBAR 120 to electrode 162 of FBAR 160, an electrical trace 179 that extends from trace 171 to center-tap 137, and an electrical trace 175 that extends from electrode 164 of FBAR 160 to terminal pad 174. Also shown are terminal pads 163 and 168 interconnected by an electrical trace 169 that provide local grounds for terminal pads 134 and 174. In the example shown, electrical trace 169 additionally extends to terminal pad 178. In other examples, terminal pad 178 is left floating.

The electrical connections exemplified in FIG. 5D provide a FACT with a balanced primary and a 4:1 impedance transformation ratio or a FACT with a balanced secondary and a 1:4 impedance transformation ratio. The lower FBARs may alternatively be interconnected in parallel, series, and anti-series, and the upper FBARs may alternatively be interconnected in parallel, anti-parallel and anti-series to achieve other impedance transformation ratios as shown in Table 1 below.

TABLE 1

|  | Parallel | Series | Anti-parallel. | Anti-series |
| --- | --- | --- | --- | --- |
| Parallel | U 1:1 LOW | X | X | U 1:4 |
| Series | X | B 1:1 HIGH | B 4:1 | X |
| Anti-parallel. | X | B 1:4 | B 1:1 LOW | X |
| Anti-series | U 4:1 | X | X | U 1:1 HIGH |

In Table 1, the row captions indicate the configuration of electrical circuit 141, the column captions indicate the configuration of electrical circuit 142, B denotes that the FACT is electrically balanced, U denotes that the FACT is unbalanced, and X denotes a non-functioning FACT. The impedance transformation ratio shown is the impedance transformation from the configuration of electrical circuit 141 indicated by the row caption to the configuration of electrical circuit 142 indicated by the column caption. For the configurations having a 1:1 impedance transformation ratio, LOW denotes that the FACT has a low impedance, equivalent to that of two FBARs in parallel, and HIGH indicates that the FACT has a high impedance, equivalent to that of two FBARs in series.

In embodiments of FBAR devices 100, 200 and 300 described above, temperature-compensating element 109 is composed of one or more temperature-compensating layers of a niobium-cobalt alloy. In *Anomalous Temperature Dependence of Elastic Constants in Nb—Mo Alloys*, 39 PHYS. LETT., 261–262 (1972) W. C. Hubbell at al. report data from which the inventor has calculated a positive temperature coefficient of propagation velocity for a shear mode of about 300 ppm/° C. for an alloy with a 34% molybdenum fraction. Longitudinal modes typically have a lower positive temperature coefficient of propagation velocity. Alloys with a molybdenum fraction in the range from about 17% to about 51% should also have a positive temperature coefficient, and alloys with a molybdenum fraction in the range from about 32% to about 36% should have a high positive temperature coefficient. As noted above, a high positive temperature coefficient allows a relatively thin temperature-compensating element to provide a useful reduction in the temperature coefficient of the FBAR device. The thickness of the temperature-compensating element is calculated using equation (1) to obtain a desired temperature coefficient less than the temperature coefficient of a similar FBAR device without a temperature-compensating element.

Such niobium-molybdenum alloy can be deposited by sputtering from a target of the alloy or by co-evaporation from a crucible of niobium and a crucible of molybdenum. The alloy is patterned by photolithography and dry etching.

In embodiments of FBAR devices 100, 200 and 300 described above, temperature-compensating element 109 is composed of one or more temperature-compensating layers of a cobalt-palladium alloy. In *Thermal Expansion Coefficient and the Temperature Coefficient of Young's Modulus of Cobalt and Palladium Alloys*, 11 TRANS. JPN. INST. OF METALS, 91–93 (1970), H. Masumoto at al. report data from which the inventor has calculated a positive temperature coefficient of propagation velocity for longitudinal modes of about 300 ppm/° C. for an alloy with a 94% palladium fraction. Alloys with a palladium fraction in the range from about 92% to about 96% should also have a positive temperature coefficient, and alloys with a palladium fraction in the range from about 93% to about 95% should have a high positive temperature coefficient. The advantages of such a high positive temperature coefficient are described above.

Such cobalt-palladium alloy can be deposited by sputtering from a target of the alloy or by co-evaporation from a crucible of cobalt and a crucible of palladium. The alloy is patterned by photolithography and dry etching.

In embodiments of FBAR devices 100, 200 and 300 described above, temperature-compensating element 109 is composed of one or more temperature-compensating layers of a ferroelectric material. Ferroelectric materials are typically electrically insulating.

Lead nickel niobate is a ferroelectric material with a high positive temperature coefficient. In *Brillouin and Dielectric Studies of the Phase Transition in the Relaxor Ferroelectric $Pb(Ni_{1/3}Nb_{2/3})O_3$*, 91 J. APPL. PHYS., 2262–2266 (2002), Fan et al. report data that suggests a positive temperature coefficient of 371 ppm/° C. for lead nickel niobate with a nickel fraction of about one third. The advantages of such a high positive temperature coefficient are described above.

Such lead nickel niobate can be deposited by sputtering using a from a target of $PbNiNbO3$ or from targets of intermediate oxides. Lead nickel niobate is patterned by photolithography and dry etching.

Another useable ferroelectric material is nepheline (($KAlSiO_4$)($NaAlSiO_4$)$_3$). In *Elastic and Thermoelastic Constants of Nepheline*, 46 J. APPL. PHYS., 4339–4340 (1975) L. J. Bonczar et al. report that the elastic constants of nepheline exhibit a positive temperature coefficient of 25 ppm/° C. Nepheline can be deposited by sputtering and patterned by photolithography and dry etching.

Another useable ferroelectric material is zirconium tungstate ($ZrW_2O_8$). In *Origin of Negative Thermal Expansion In Cubic $ZrW_2O_8$ Revealed by High Pressure Inelastic Neutron Scattering*, 86 PHYS. REV. LETT., 4692–4895 (2001), R. Mittel et al. disclose a material that has a linear coefficient of thermal expansion of −27 ppm/° C. This negative expansion coefficient suggests that the material will produce a high positive temperature coefficient of the resonant frequency when used as the material of temperature-compensating element 109. Zirconium tungstate can be deposited by sputtering and patterned by photolithography and dry etching.

Wafer-scale fabrication is used to fabricate thousands of FBAR devices similar to above-described FBAR devices 100, 200 or 300 at the same time. Such wafer-scale fabrication makes the FBAR devices inexpensive to fabricate. An example of the fabrication method used to fabricate an embodiment of FBAR device 200 described above with reference to FIGS. 4A and 4B will be described next with reference to the plan views of FIGS. 6A-6J and the cross-sectional views of FIGS. 6K–6T. With different masks, the process can also be used to fabricate embodiments of FBAR devices 100 and 300. The pass band of the embodiment of FBAR device 200 whose fabrication will be described has a nominal center frequency of about 1.9 GHz. Embodiments for operation at other frequencies are similar in structure and fabrication but have thicknesses and lateral dimensions different from those exemplified below. The example of FBAR device 200 whose fabrication will be described below has temperature-compensating element similar in structure to temperature-compensating element 109 described above with reference to FIGS. 4A and 4B. The described process can be modified to fabricate temperature-compensating element 109 with configurations similar to those described above with reference to FIGS. 3C–3F.

A wafer of single-crystal silicon is provided. A portion of the wafer constitutes, for each FBAR device being fabricated, a substrate corresponding to the substrate 102 of FBAR device 200. FIGS. 6A–6J and FIGS. 6K–6T illustrate and the following description describes the fabrication of FBAR device 200 in and on a portion of the wafer that constitutes substrate 102. As FBAR device 200 is fabricated, the remaining FBAR devices on the wafer are similarly fabricated.

Figure 6A:
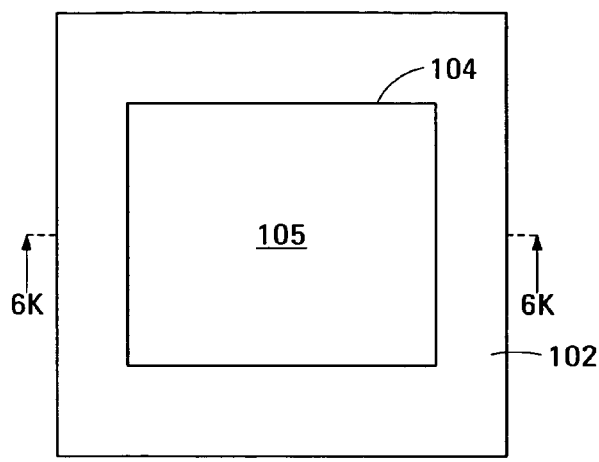
FIGS. 6A–6J are plan views illustrating a process for making an embodiment of an FBAR device in accordance with the invention.
Figure 6K:
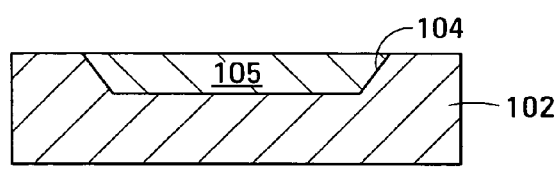
FIGS. 6K–6T are cross-sectional views along the section lines 6K—6K through 6T—6T, respectively, in FIGS. 6A–6J, respectively.

The wafer is selectively wet etched to form a cavity 104, as shown in FIGS. 6A and 6K, in the location of each FBAR device. A layer of fill material (not shown) is deposited on the surface of the wafer with a thickness sufficient to fill each cavity. The surface of the wafer is then planarized, leaving each cavity filled with fill material. FIGS. 6A and 6K show cavity 104 in substrate 102 filled with fill material 105.

In an embodiment, the fill material was phosphosilicate glass (PSG) and was deposited using conventional low-pressure chemical vapor deposition (LPCVD). The fill material may alternatively be deposited by sputtering or by spin coating.

As an alternative to forming and filling cavity 104 with fill material 105, alternating Bragg layers of metal and plastic are deposited on the surface of wafer 102 and are patterned to define an acoustic Bragg reflector as described by Larson III et al. in U.S. patent application Ser. No. 10/969,744 entitled Cavity-less Film Bulk Acoustic Resonator (FBAR) Devices, assigned to the assignee of this disclosure and incorporated by reference.

Figure 6B:
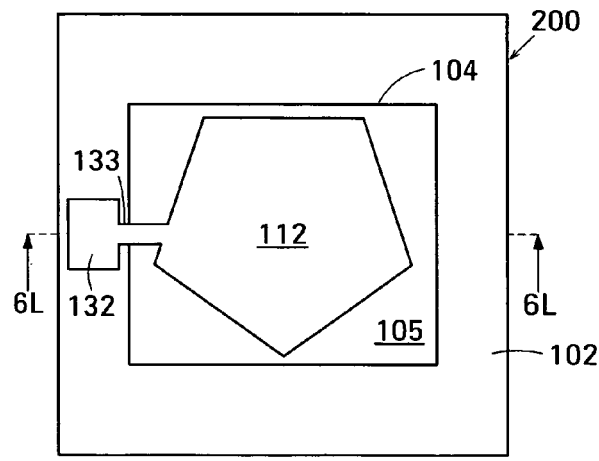
Figure 6L:
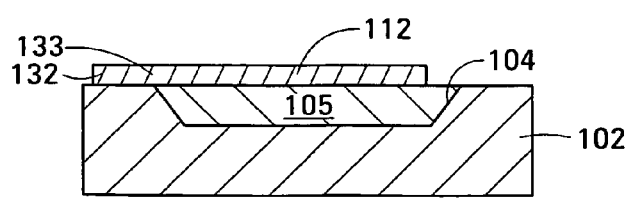

A first metal layer is deposited on the major surface of substrate 102 and fill material 105. The first metal layer is patterned as shown in FIGS. 6B and 6L to define electrode 112, terminal pad 132, and electrical trace 133 extending between electrode 112 and terminal pad 132.

Electrode 112 typically has an asymmetrical shape in a plane parallel to the major surface of the wafer. An asymmetrical shape minimizes lateral modes in FBAR 110 (FIG. 4B) of which electrode 112 forms part. This is described in U.S. Pat. No. 6,215,375 of Larson III et al., incorporated by reference. Electrode 112 leaves part of the surface of fill material 105 exposed so that the fill material can later be removed by etching, as will be described below.

Referring additionally to FIG. 4B, electrode 114 is defined in a second metal layer, electrode 122 is defined in a third metal layer and electrode 124 is defined in a fourth metal layer, as will be described in detail below. The metal layers in which the electrodes are defined are patterned such that, in respective planes parallel to the major surface of the wafer, electrodes 112 and 114 of FBAR 110 have the same shape, size, orientation and position and electrodes 122 and 124 of FBAR 120 have the same shape, size, orientation and position. Typically, electrodes 114 and 122 additionally have the same shape, size, orientation and position.

In an embodiment, the material of each of the metal layers was molybdenum deposited by sputtering to a thickness of about 300 nm. The metal layers were each patterned by dry etching. The electrodes defined in each of the metal layers were pentagonal each with an area of about 12,000 square µm. Other electrode areas give other characteristic impedances. Other refractory metals such as tungsten, niobium and titanium may alternatively be used as the material of the metal layers. The metal layers may each alternatively comprise layers of more than one material.

One factor to be considered in choosing the material of the electrodes of FBAR device 300 is the acoustic properties of the electrode material: the acoustic properties of the material(s) of the remaining metal parts of FBAR device are less important than other properties such as electrical conductivity. Thus, material(s) of the remaining metal parts of FBAR device 300 may be different from the material of the electrodes.

Figure 6C:
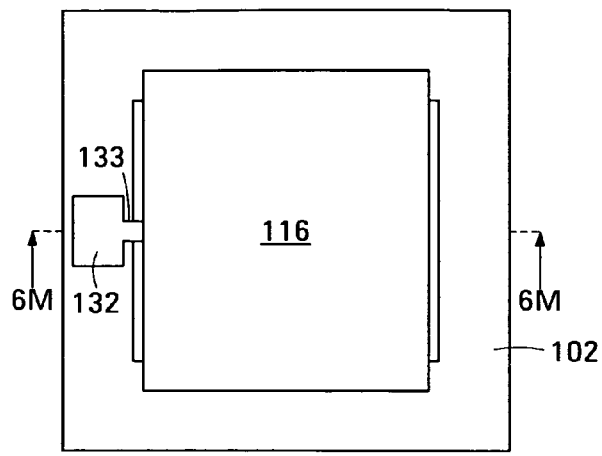
Figure 6M:
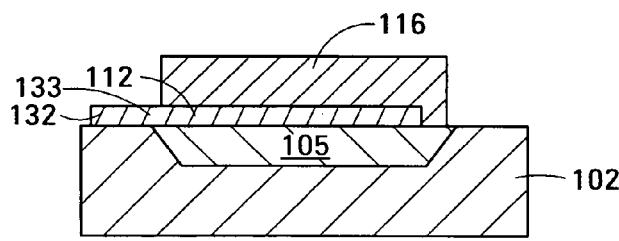

A layer of piezoelectric material is deposited and is patterned as shown in FIGS. 6C and 6M to define piezoelectric element 116. The piezoelectric layer is patterned to cover electrode 112, but to expose terminal pad 132 and part of the surface of fill material 105. Other portions of piezoelectric element 116 extend over substrate 102 outside cavity 104.

In an embodiment, the piezoelectric material deposited to form piezoelectric element 116 and piezoelectric element 126 described below was aluminum nitride and was deposited with a thickness of about 1.4 µm by sputtering. The piezoelectric material was patterned by wet etching in potassium hydroxide or by chlorine-based dry etching. Alternative materials for piezoelectric elements 116 and 126 include zinc oxide, cadmium sulfide and poled ferroelectric materials such as perovskite ferroelectric materials, including lead zirconium titanate, lead meta niobate and barium titanate.

Figure 6D:
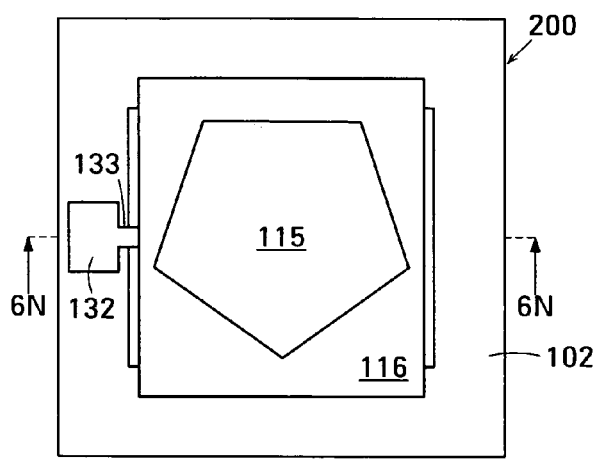
Figure 6N:
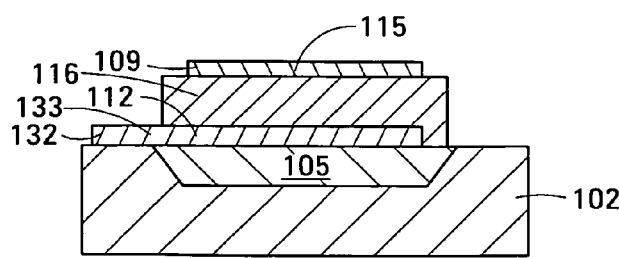

A first layer of temperature-compensating material is deposited and is patterned as shown in FIGS. 6D and 6N to define temperature-compensating layer 115, which constitutes part of temperature-compensating element 109. The temperature-compensating material is patterned to have the same shape, size, orientation and position as electrode 112.

In an embodiment, the material of the first layer of temperature-compensating material and of the second layer of temperature-compensating material whose deposition will be described below was a palladium-cobalt alloy with a palladium fraction of about 94%. The temperature-compensating material was deposited by sputtering and was patterned by dry etching. The layer thickness depended on the desired temperature coefficient of FBAR device 200 (FIG. 4A.

Figure 6E:
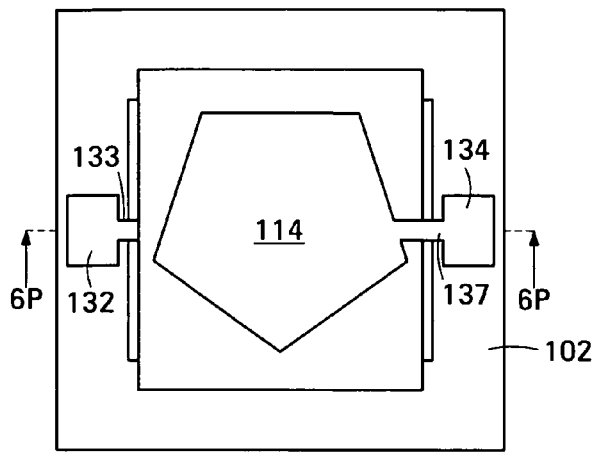
Figure 6O:
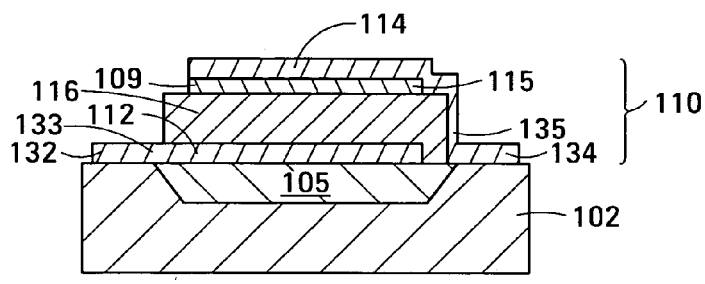

The second metal layer is deposited and is patterned to define electrode 114, terminal pad 134 and electrical trace 135 extending between electrode 114 and terminal pad 134, as shown in FIGS. 6E and 6O. This completes fabrication of FBAR 110.

Figure 6F:
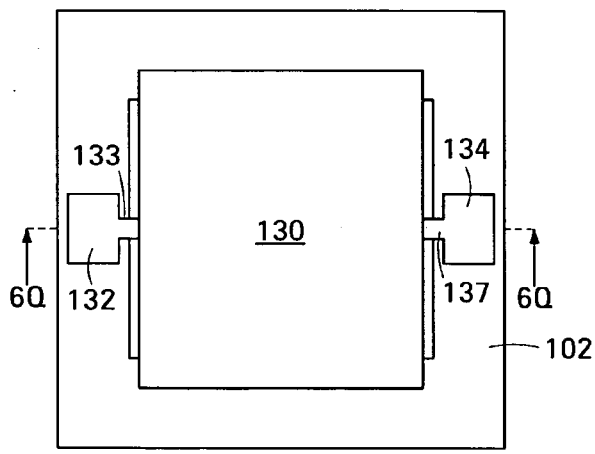
Figure 6P:
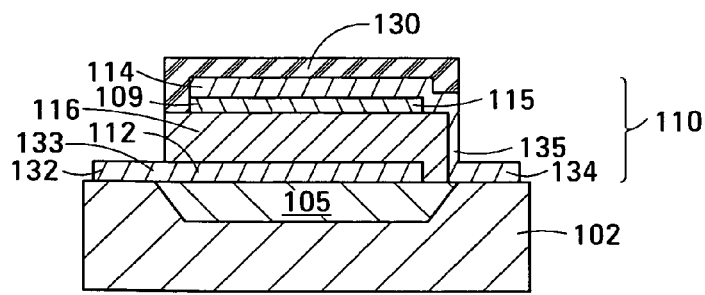

A layer of acoustic decoupling material is then deposited and is patterned to define acoustic decoupler 130, as shown in FIGS. 6F and 6P. Acoustic decoupler 130 is patterned to cover at least electrode 114, and is additionally patterned to expose terminal pads 132 and 134 and part of fill material 105. Acoustic decoupler is typically a quarter-wave layer of plastic material.

In an embodiment, the acoustic decoupling material of acoustic decoupler 130 was polyimide with a thickness of about 200 nm, i.e., one quarter of the center frequency wavelength in the polyimide. The polyimide was deposited by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the acoustic decoupling material was polyimide, after depositing and patterning the polyimide, the wafer was baked initially at a temperature of about 250° C. in air and finally at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing separation of subsequently-deposited layers.

Figure 6G:
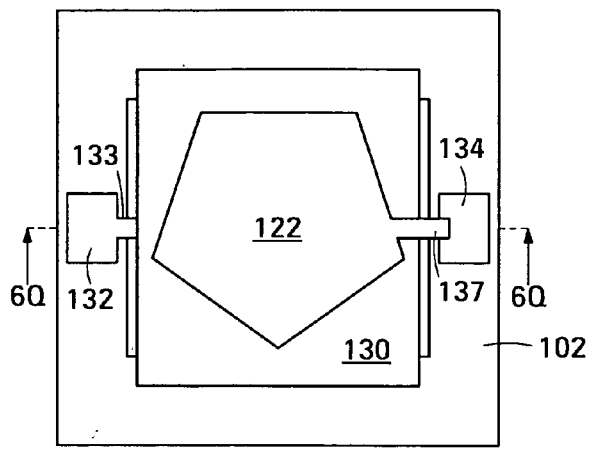
Figure 6Q:
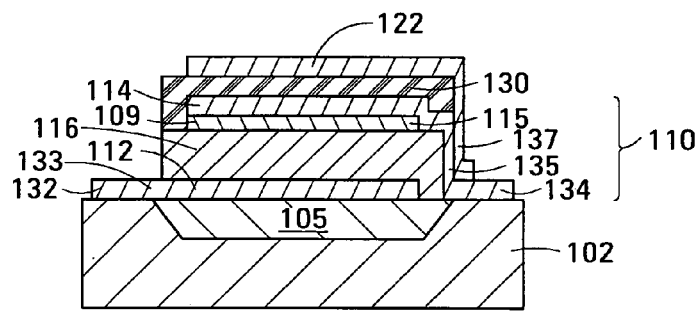

The third metal layer is deposited and is patterned to define electrode 122 and electrical trace 137 extending from electrode 122 to terminal pad 134, as shown in FIGS. 6G and 6Q. Terminal pad 134 is also electrically connected to electrode 114 by trace 135.

Figure 6H:
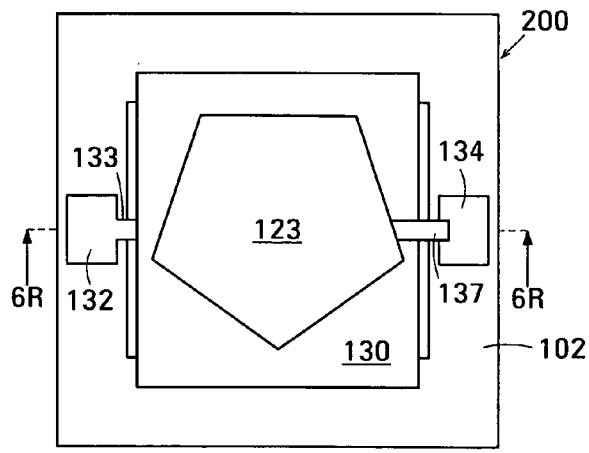
Figure 6R:
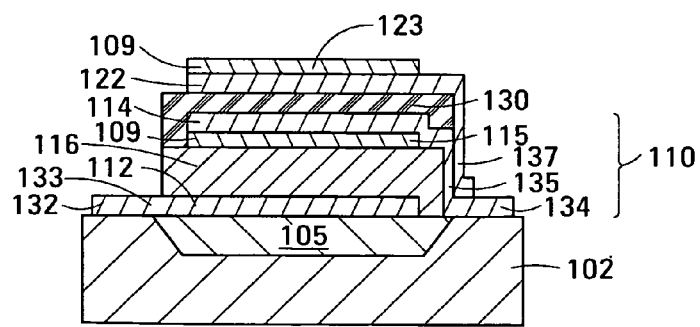

A second layer of temperature-compensating material is deposited and is patterned as shown in FIGS. 6H and 6R to define temperature-compensating layer 123, which constitutes the remainder of temperature-compensating element 109 in this embodiment. The temperature-compensating material is patterned to have the same shape, size, orientation and position as electrode 122.

Figure 6I:
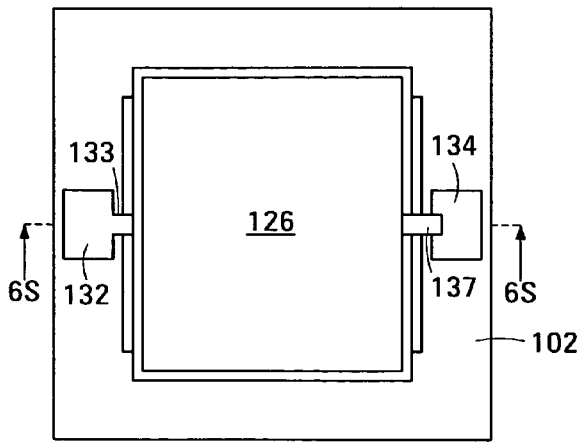
Figure 6S:
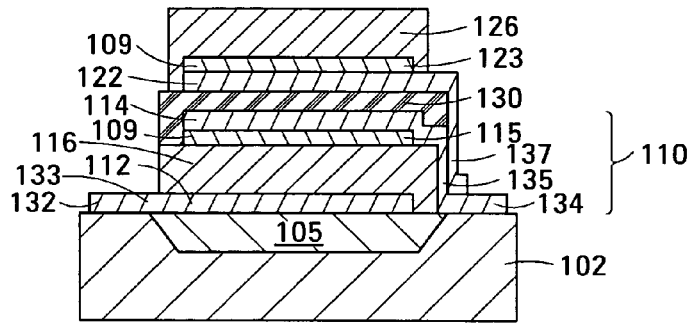

The second layer of piezoelectric material is deposited and is patterned as shown in FIGS. 6I and 6S to define piezoelectric element 126. The second piezoelectric layer is patterned to expose terminal pads 132 and 134 and part of fill material 105.

Figure 6J:
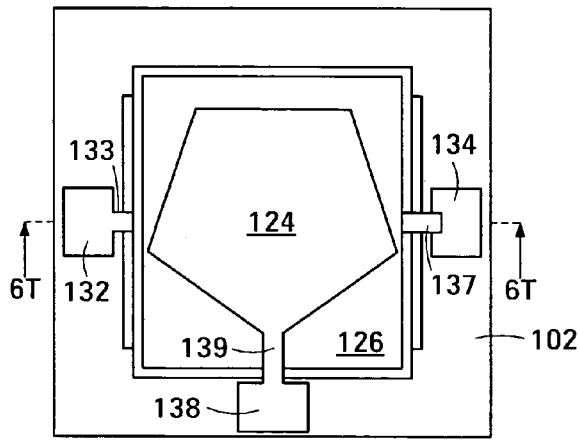
Figure 6T:
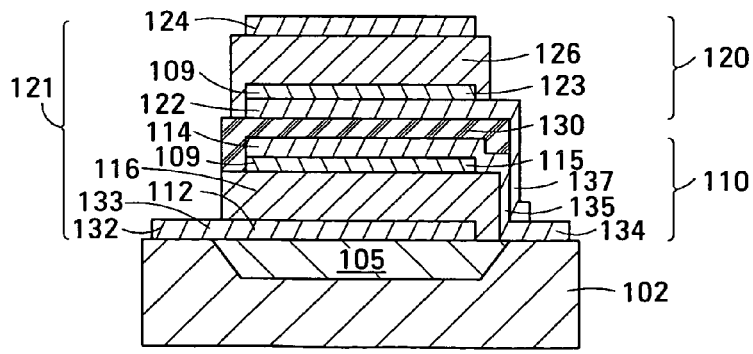

The fourth metal layer is deposited and is patterned to define electrode 124, terminal pad 138 and an electrical trace 139 extending from electrode 124 to terminal pad 138, as shown in FIGS. 6J and 6T. This completes fabrication of FBAR 120 and FBAR stack 211.

A gold protective layer (not shown) is deposited on the exposed surfaces of terminal pads 132, 134 and 138.

A release etch is performed to remove sacrificial material 105 from cavity 104. This leaves FBAR device 200 as shown in FIGS. 4A and 4B.

The wafer is then divided into individual FBAR devices, including FBAR device 200.

FBAR device 200 is mounted in a host electrical apparatus, such as a wireless telephone, and electrical connections are made between terminal pads 132, 134 and 138 of the FBAR device and pads that are part of the host device.

As noted above, an alternative acoustic decoupling material of acoustic decoupler 130 is a crosslinked polyphenylene polymer. After the third metal layer has been patterned to define electrode 114, as described above with reference to FIGS. 6E and 6O, the precursor solution for the crosslinked polyphenylene polymer is spun on in a manner similar to that described above with reference to FIGS. 6F and 6P, but is not patterned. The formulation of the precursor solution and the spin speed are selected so that the crosslinked polyphenylene polymer forms a layer with a thickness of about 187 nm. This corresponds to one quarter of the wavelength $\lambda_n$ in the crosslinked polyphenylene polymer of an acoustic signal having a frequency equal to the center frequency of the pass band of FBAR device 200. After depositing the layer of the precursor solution, the wafer was baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

In an embodiment, the precursor solution for the crosslinked polyphenylene polymer was one sold by The Dow Chemical Company and designated SiLK™ J. Alternatively, the precursor solution may be any suitable one of the precursor solutions now or in the future sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used.

The third metal layer is then deposited on the layer of the crosslinked polyphenylene polymer in a manner similar to that described above with reference to FIGS. 6G and 6Q, but is initially patterned similarly to the patterning of acoustic decoupler 130 shown in FIG. 6F to define a hard mask that will later be used to pattern the layer of the crosslinked polyphenylene polymer to define acoustic decoupler 130. The initially-patterned third metal layer has the same extent as acoustic decoupler 130 and exposes terminal pads 132 and 134 and parts of fill material 105.

The layer of the crosslinked polyphenylene polymer is then patterned as shown in FIG. 6F with the initially-patterned third metal layer being used as a hard etch mask. Patterning the layer of the crosslinked polyphenylene polymer defines the extent of acoustic decoupler 130, which exposes terminal pads 132 and 134 and parts of fill material 105. The patterning is performed with an oxygen plasma etch.

The third metal layer is then re-patterned as shown in FIGS. 6G and 6Q to define electrode 122 and electrical trace 137 extending between electrode 122 and terminal pad 134.

Fabrication of the embodiment of FBAR device 200 with a layer of a crosslinked polyphenylene polymer as its acoustic decoupler is completed by performing the processing described above with reference to FIGS. 6H–6J and 6R–6T.

A similar technique similar to that just describe can be used to define acoustic decoupler 103 in a layer of parylene deposited by vacuum deposition.

The above-exemplified electrode and piezoelectric element thicknesses are thicknesses for a conventional FBAR device similar to an embodiment of FBAR 200 without temperature-compensating element 109. In an embodiment of FBAR device 200, one or more of the thicknesses are reduced to maintain the center frequency of the FBAR device notwithstanding the addition of temperature-compensating element 109 to FBAR stack 211. The identity of the one or more elements whose thicknesses are reduced and the respective thickness reductions depends on the thickness and material of temperature-compensating element 109 and the amount of temperature compensation provided by temperature-compensating element 109. The identity of the elements and the thickness reductions additionally depends on the application in which the FBAR device will be used, as described above. Reducing the thickness of piezoelectric elements reduces the coupling constant: reducing the thickness of one or more of the electrodes increases the series resistance unless the temperature-compensating material has an electrical conductivity comparable with that of the electrodes.

This disclosure describes the invention in detail using illustrative embodiments. However, the invention defined by the appended claims is not limited to the precise embodiments described.

I claim:

1. A temperature-compensated film bulk acoustic resonator (FBAR) device, comprising:
an FBAR stack, comprising:
an FBAR characterized by a resonant frequency having a temperature coefficient, the FBAR comprising opposed planar electrodes and a piezoelectric element between the electrodes, the piezoelectric element having a temperature coefficient on which the temperature coefficient of the resonant frequency depends at least in part, and
a temperature-compensating element having a temperature coefficient opposite in sign to the temperature coefficient of the piezoelectric element, and the temperature-compensating element comprises one of: a niobium-molybdenum (Nb—Mo): a cobalt—palladium (Co—Pd) alloy: or a niobium-molybdenum (Nb—Mo) alloy.

2. The FBAR device of claim 1, in which the temperature-compensating element comprises a temperature-compensating layer juxtaposed with one of the electrodes.

3. The FBAR device of claim 2, in which the temperature-compensating element additionally comprises an additional temperature-compensating layer juxtaposed with the other of the electrodes.

4. The FBAR device of claim 2, in which the temperature-compensating layer is located between the one of the electrodes and the piezoelectric element.

5. The FBAR device of claim 2, in which:
the FBAR is a lower FBAR; and
the FBAR device additionally comprises:
an upper FBAR stacked on the lower FBAR, the upper FBAR comprising opposed planar electrodes and a piezoelectric element between the electrodes, and
an acoustic decoupler between the FBARs.

6. The FBAR device of claim 5, in which the temperature-compensating element comprises a temperature-compensating layer juxtaposed with one of the electrodes of each of the FBARs.

7. The FBAR device of claim 6, in which in each of the FBARs, the temperature-compensating layer is between the one of the electrodes and the piezoelectric element thereof.

8. The FBAR device of claim 6, in which in each of the FBARs, the one of the electrodes is juxtaposed with the acoustic decoupler.

9. The FBAR device of claim 5, in which in each of the FBARs, one of the electrodes is juxtaposed with the acoustic decoupler.

10. The FBAR device of claim 5, in which:
the first FBAR, the second FBAR and the acoustic decoupler constitute a first decoupled stacked bulk acoustic resonator (DSBAR);
the FBAR stack additionally comprises a second DSBAR, comprising a lower FBAR, an upper FBAR stacked on the lower FBAR, and an acoustic decoupler between the FBARs; and
the FBAR device additionally comprises:
a first electrical circuit interconnecting the lower FBARs, and
a second electrical circuit interconnecting the upper FBARs.

11. The FBAR device of claim 10, in which the temperature-compensating element comprises a temperature-compensating layer juxtaposed with one of the electrodes of each of the FBARs.

12. The FBAR device of claim 11, in which in each of the FBARs, the temperature-compensating layer is between the one of the electrodes and the piezoelectric element thereof.

13. The FBAR device of claim 11, in which in each of the FBARs, the one of the electrodes is juxtaposed with the acoustic decoupler.

14. The FBAR device of claim 10, in which in each of the FBARs, one of the electrodes is juxtaposed with the acoustic decoupler.

15. The FBAR device of claim 2, in which:
the FBAR is a first FBAR;
the FBAR stack additionally comprises one or more additional FBARs; and
the FBARs are interconnected as a ladder filter.

16. The FBAR device of claim 15, in which the temperature-compensating element comprises a temperature-compensating layer juxtaposed with one of the electrodes of each of the FBARs.

17. The FBAR device of claim 1, in which the temperature-compensating element comprises a temperature-compensating layer embedded in the piezoelectric element.

18. The FBAR device of claim 17, in which:
the FBAR is a lower FBAR; and
the FBAR device additionally comprises:
an upper FBAR stacked on the lower FBAR, the upper FBAR comprising opposed planar electrodes and a piezoelectric element between the electrodes, and
an acoustic decoupler between the FBARs.

19. The FBAR device of claim 18, in which the temperature-compensating element comprises a temperature-compensating layer embedded in the piezoelectric element of each of the FBARs.

20. The FBAR device of claim 18, in which;
the lower FBAR, the upper FBAR and the acoustic decoupler constitute a first decoupled stacked bulk acoustic resonator (DSBAR);
the FBAR stack additionally comprises a second DSBAR, comprising a lower FBAR, an upper FBAR, an acoustic decoupler between the FBARs; and
the FBAR device additionally comprises:
a first electrical circuit interconnecting the lower FBARs, and
a second electrical circuit interconnecting the upper FBARs.

21. The FBAR device of claim 20 in which the temperature-compensating element comprises a temperature-compensating layer embedded in the piezoelectric element of each of the FBARs.

22. The FBAR device of claim 17, in which:
the FBAR is a first FBAR;
the FBAR stack additionally comprises one or more additional FBARs; and
the FBARs are interconnected as a ladder filter.

23. The FBAR device of claim 22, in which the temperature-compensating element comprises a temperature-compensating layer embedded in the piezoelectric element of each of the FBARs.

24. The FBAR device of claim 1, in which the temperature-compensating element comprises one of the electrodes.

25. The FBAR device of claim 24, in which:
the FBAR is a lower FBAR;
the FBAR device additionally comprises:
an upper FBAR stacked on the lower FBAR, the upper FBAR comprising a piezoelectric element, and
an acoustic decoupler between the FBARs; and
the temperature-compensating element additionally comprises opposed temperature-compensating layers between which the piezoelectric element of the upper FBAR is located.

26. The FBAR device of claim 25, in which the temperature-compensating element comprises one of the electrodes of each of the FBARs.

27. The FBAR device of claim 25, in which:
the lower FBAR, the upper FBAR and the acoustic decoupler constitute a first decoupled stacked bulk acoustic resonator (DSBAR);
the FBAR stack additionally comprises a second DSBAR, comprising a lower FBAR, an upper FBAR, an acoustic decoupler between the FBARs; and
the FBAR device additionally comprises:

a first electrical circuit interconnecting the lower FBARs, and a second electrical circuit interconnecting the upper FBARs.

28. The FBAR device claim 27, in which the temperature-compensating element comprises one of the electrodes of each of the FBARs.

29. The FBAR device of claim 24, in which:
the FBAR is a first FBAR;
the FBAR stack additionally comprises one or more additional FBARs; and
the FBARs are interconnected as a ladder filter.

30. The FBAR device of claim 29, in which the temperature-compensating element comprises one of the electrodes of each of the FBARs.

31. The FBAR device of claim 1, in which the cobalt-palladium alloy has a palladium fraction in the range from about 93% to about 95%.

32. The FBAR device of claim 1, in which the niobium-molybdenum alloy has a molybdenum fraction in the range from about 17% to about 51%.

33. The FBAR device of claim 1, in which the niobium-molybdenum alloy has a molybdenum fraction in the range from about 32% to about 36%.

34. The FBAR device of claim 1, in which the cobalt-palladium alloy has a palladium fraction in the range from about 92% to about 96%.

35. An acoustic device, comprising an acoustic propagation path having a propagation time-related property, the propagation time-related property having a temperature coefficient, the acoustic propagation path comprising:
an acoustic propagation element having a temperature coefficient on which the propagation time-related property of the acoustic propagation path depends at least in part; and
a temperature-compensating element having a temperature coefficient opposite in sign to the temperature coefficient of the acoustic propagation element, and the temperature-compensating element comprises one of: a niobium-molybdenum (Nb—Mo);
a cobalt-palladium (Co—Pd) alloy; or a niobium-molybdenum (Nb—Mo) alloy.

36. A temperature-compensated film bulk acoustic resonator (FBAR) device, comprising:
an FBAR stack, comprising:
an FBAR characterized by a resonant frequency having a temperature coefficient, the FBAR comprising opposed planar electrodes and a piezoelectric element between the electrodes, the piezoelectric element having a temperature coefficient on which the temperature coefficient of the resonant frequency depends at least in part, and a temperature-compensating element having a temperature coefficient opposite in sign to the temperature coefficient of the piezoelectric element, wherein the temperature-compensating element comprises a ferroelectric material, which comprises one of:
lead nickel niobate ($Pb(Ni_xNb_{i-x})O_3$ in which the nickel fraction x is about one third; nepheline ($KAlSiO_4$) ($NaAlSiO_4)_3$; or zirconium tungstate ($ZrW_2O_8$).

37. An acoustic device, comprising an acoustic propagation path having a propagation time-related property, the propagation time-related property having a temperature coefficient, the acoustic propagation path comprising:
an acoustic propagation element having a temperature coefficient on which the propagation time-related property of the acoustic propagation path depends at least in part; and
a temperature-compensating element having a temperature coefficient opposite in sign to the temperature coefficient of the acoustic propagation element, wherein the temperature compensating element comprises a ferroelectric material, which comprises one of:
lead nickel niobate ($Pb(Ni_xNb_{1-x})O_3$ in which the nickel fraction x is about one third; nepheline ($KAlSiO_4$) ($NaAlSiO_4)_3$; or zirconium tungstate ($ZrW_2O_8$).

* * * * *

UNITED STATES PATENT AND TRADEMARK OFFICE
CERTIFICATE OF CORRECTION

PATENT NO. : 7,408,428 B2  Page 1 of 1
APPLICATION NO. : 10/977398
DATED : August 5, 2008
INVENTOR(S) : John D. Larson, III It is certified that error appears in the above-identified patent and that said Letters Patent is hereby corrected as shown below:

Column 1, Line 17, delete "Pars" and insert -- Pass --;

Column 23, Line 2, Claim 1, delete "Mo):" and insert -- Mo); --;

Column 23, Line 3, Claim 1, delete "alloy:" and insert -- alloy; --;

Column 25, Line 5, Claim 28, delete "device" and insert -- device of --;

Column 26, Line 19, Claim 36, delete "(Pb(Ni$_x$Nb$_{i-x}$)O$_3$" and insert -- Pb(NixNbl-x)03 --;

Column 26, Line 35, Claim 36, delete "(Pb(Ni$_x$Nb$_{l-x}$)O$_3$" and insert -- Pb(NixNbl-x)03 --;

Signed and Sealed this

Ninth Day of November, 2010

David J. Kappos
*Director of the United States Patent and Trademark Office*